(12) United States Patent
Pflughaupt et al.

(10) Patent No.: US 6,897,565 B2
(45) Date of Patent: May 24, 2005

(54) STACKED PACKAGES

(75) Inventors: L. Elliott Pflughaupt, Los Gatos, CA (US); David Gibson, Lake Oswego, CA (US); Young-Gon Kim, Cupertino, CA (US); Craig S. Mitchell, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/267,450

(22) Filed: Oct. 9, 2002

(65) Prior Publication Data

US 2003/0107118 A1 Jun. 12, 2003

Related U.S. Application Data

(60) Provisional application No. 60/328,038, filed on Oct. 9, 2001.

(51) Int. Cl.[7] .................................. H01L 23/48
(52) U.S. Cl. .................. 257/777; 257/692; 257/693; 257/696
(58) Field of Search ................... 257/692–696, 257/777; 438/109, 118

(56) References Cited

U.S. PATENT DOCUMENTS

| | | |
|---|---|---|
| 3,390,308 A | 6/1968 | Marley |
| 3,614,832 A | 10/1971 | Chance et al. |
| 3,683,105 A | 8/1972 | Shamash et al. |
| 3,832,769 A | 9/1974 | Olyphant, Jr. et al. |
| 3,868,724 A | 2/1975 | Perrino |
| 3,923,359 A | 12/1975 | Newsam |

(Continued)

FOREIGN PATENT DOCUMENTS

| | | |
|---|---|---|
| EP | 072673 | 8/1982 |
| JP | 52-075981 | 6/1977 |
| JP | 56-61151 | 5/1981 |

(Continued)

OTHER PUBLICATIONS

"Megabyte Per Cubic Inch," Defense Science, May 1988, p. 56.
"Three–Dimensional Packaging," Defense Science, May 1988, p. 65.
Forthun, U.S. patent application Ser. No. 07/552,578, filed Jul. 13, 1990.
Bang, U.S. Provisional patent application Ser. No. 60/408,644, filed Sep. 6, 2002.
IBM Technical Disclosure Bulletin, Jan. 1985, vol. 27, No. 8, p. 4855.
Press Release and attachments, International Microelectronic Component Industries, Oct. 1, 1994.
Official Action mailed Jun. 24, 2004, in U.S. Appl. No. 10/430,986.

*Primary Examiner*—Dung A. Le
(74) *Attorney, Agent, or Firm*—Lerner, David, Littenberg, Krumholz & Mentlik, LLP

(57) ABSTRACT

A stacked chip assembly includes individual units having chips mounted on dielectric layers and traces on the dielectric layers interconnecting the contacts of the chips with terminals disposed in peripheral regions of the dielectric layers. At least some of the traces are multi-branched traces which connect chip select contacts to chip select terminals. The units are stacked one above the other with corresponding terminals of the different units being connected to one another by solder balls or other conductive elements so as to form vertical buses. Prior to stacking, the multi-branched traces of the individual units are selectively interrupted, as by breaking the individual branches, so as to leave chip select contacts of chips in different units connected to different chip select terminals and thereby connect these chips to different vertical buses. The individual units desirably are thin and directly abut one another so as to provide a low-height assembly with good heat transfer from chips within the stack.

31 Claims, 10 Drawing Sheets

U.S. PATENT DOCUMENTS

| | | |
|---|---|---|
| 4,216,577 A | 8/1980 | Badet et al. |
| 4,371,744 A | 2/1983 | Badet et al. |
| 4,371,912 A | 2/1983 | Guzik |
| 4,489,364 A | 12/1984 | Chance |
| 4,540,226 A | 9/1985 | Thompson et al. |
| 4,551,746 A | 11/1985 | Gilbert et al. |
| 4,558,397 A | 12/1985 | Olsson |
| 4,627,151 A | 12/1986 | Mulholland et al. |
| 4,628,406 A | 12/1986 | Smith et al. |
| 4,638,348 A | 1/1987 | Brown et al. |
| 4,681,654 A | 7/1987 | Clementi et al. |
| 4,701,999 A | 10/1987 | Palmer |
| 4,710,798 A | 12/1987 | Marcantonio |
| 4,734,825 A | 3/1988 | Peterson |
| 4,746,392 A | 5/1988 | Hoppe |
| 4,754,316 A | 6/1988 | Reid |
| 4,761,681 A | 8/1988 | Reid |
| 4,772,936 A | 9/1988 | Reding et al. |
| 4,812,421 A | 3/1989 | Jung et al. |
| 4,823,234 A | 4/1989 | Konishi et al. |
| 4,829,666 A | 5/1989 | Haghiri-Tehrani et al. |
| 4,837,184 A | 6/1989 | Lin et al. |
| 4,841,355 A | 6/1989 | Parks |
| 4,855,867 A | 8/1989 | Gazdik et al. |
| 4,855,868 A | 8/1989 | Harding |
| 4,868,712 A | 9/1989 | Woodman |
| 4,878,098 A | 10/1989 | Saito et al. |
| 4,893,172 A | 1/1990 | Matsumoto et al. |
| 4,897,534 A | 1/1990 | Haghiri-Tehrani et al. |
| 4,897,918 A | 2/1990 | Osaka et al. |
| 4,918,811 A | 4/1990 | Eichelberger et al. |
| 4,937,203 A | 6/1990 | Eichelberger et al. |
| 4,956,694 A | 9/1990 | Eide |
| 4,967,261 A | 10/1990 | Niki et al. |
| 4,982,265 A | 1/1991 | Watanabe et al. |
| 4,994,902 A | 2/1991 | Okahashi et al. |
| 4,996,583 A | 2/1991 | Hatada |
| 4,996,587 A | 2/1991 | Hinrichsmeyer et al. |
| 4,999,319 A | 3/1991 | Hamano et al. |
| 5,028,986 A | 7/1991 | Sugano et al. |
| 5,029,325 A | 7/1991 | Higgins, III et al. |
| 5,037,779 A | 8/1991 | Whalley et al. |
| 5,045,921 A | 9/1991 | Lin et al. |
| 5,055,913 A | 10/1991 | Haghiri-Tehrani |
| 5,117,282 A | 5/1992 | Salatino |
| 5,127,570 A | 7/1992 | Steitz et al. |
| 5,128,831 A | 7/1992 | Fox, III et al. |
| 5,138,438 A | 8/1992 | Masayuki et al. |
| 5,148,265 A | 9/1992 | Khandros et al. |
| 5,148,266 A | 9/1992 | Khandros et al. |
| 5,172,303 A | 12/1992 | Bernardoni et al. |
| 5,198,888 A | 3/1993 | Sugano et al. |
| 5,222,014 A | 6/1993 | Lin |
| 5,247,423 A | 9/1993 | Lin et al. |
| 5,258,330 A | 11/1993 | Khandros et al. |
| 5,266,912 A | 11/1993 | Kledzik |
| 5,281,852 A | 1/1994 | Normington |
| 5,289,346 A | 2/1994 | Carey et al. |
| 5,304,252 A | 4/1994 | Condra et al. |
| 5,304,512 A | 4/1994 | Arai et al. |
| 5,311,401 A | 5/1994 | Gates, Jr. et al. |
| 5,313,096 A | 5/1994 | Eide |
| 5,334,875 A | 8/1994 | Sugano et al. |
| 5,337,077 A | 8/1994 | Browne |
| 5,346,861 A | 9/1994 | Khandros et al. |
| 5,350,947 A | 9/1994 | Takekawa et al. |
| 5,376,825 A | 12/1994 | Tukamoto et al. |
| 5,379,191 A | 1/1995 | Carey et al. |
| 5,384,689 A | 1/1995 | Shen |
| 5,390,844 A | 2/1995 | Distefano et al. |
| 5,394,009 A | 2/1995 | Loo |
| 5,397,916 A | 3/1995 | Normington |
| 5,397,921 A | 3/1995 | Karnezos |
| 5,409,865 A | 4/1995 | Karnezos |
| 5,412,247 A | 5/1995 | Martin |
| 5,455,740 A | 10/1995 | Burns |
| 5,479,318 A | 12/1995 | Burns |
| 5,489,749 A | 2/1996 | DiStefano et al. |
| 5,543,664 A | 8/1996 | Burns |
| 5,548,091 A | 8/1996 | DiStefano et al. |
| 5,552,631 A | 9/1996 | McCormick |
| 5,552,963 A | 9/1996 | Burns |
| 5,564,181 A | 10/1996 | Dineen et al. |
| 5,600,541 A | 2/1997 | Bone et al. |
| 5,608,265 A | 3/1997 | Kitano et al. |
| 5,616,958 A | 4/1997 | Laine et al. |
| 5,625,221 A | 4/1997 | Kim et al. |
| 5,637,536 A | 6/1997 | Val |
| 5,639,695 A | 6/1997 | Jones et al. |
| 5,642,261 A | 6/1997 | Bond et al. |
| 5,656,856 A | 8/1997 | Kweon |
| 5,659,952 A | 8/1997 | Kovac et al. |
| 5,663,106 A | 9/1997 | Karavakis et al. |
| 5,668,405 A | 9/1997 | Yamashita |
| 5,677,566 A | 10/1997 | King et al. |
| 5,681,777 A | 10/1997 | Lynch et al. |
| 5,701,031 A | 12/1997 | Oguchi et al. |
| 5,734,555 A | 3/1998 | McMahon |
| 5,751,063 A | 5/1998 | Baba |
| 5,783,870 A | 7/1998 | Mostafazadeh et al. |
| 5,784,264 A | 7/1998 | Tanioka |
| 5,801,439 A | 9/1998 | Fujisawa et al. |
| 5,804,874 A | 9/1998 | An et al. |
| 5,834,339 A | 11/1998 | Distefano et al. |
| 5,835,988 A | 11/1998 | Ishii |
| 5,844,315 A | 12/1998 | Melton et al. |
| 5,861,666 A | 1/1999 | Bellaar |
| 5,883,426 A | 3/1999 | Tokuno et al. |
| 6,030,856 A | 2/2000 | DiStefano et al. |
| 6,072,233 A | 6/2000 | Corisis et al. |
| 6,093,029 A | 7/2000 | Kwon et al. |
| 6,180,881 B1 | 1/2001 | Isaak |
| 6,195,268 B1 | 2/2001 | Eide |
| 6,218,848 B1 | 4/2001 | Hembree et al. |
| 6,232,152 B1 | 5/2001 | DiStefano et al. |
| 6,268,649 B1 | 7/2001 | Corisis et al. |
| 6,272,744 B1 | 8/2001 | DiStefano et al. |
| 6,291,259 B1 | 9/2001 | Chun |
| 6,303,997 B1 | 10/2001 | Lee |
| 6,313,522 B1 | 11/2001 | Akram et al. |
| 6,335,565 B1 | 1/2002 | Miyamoto et al. |
| 6,342,728 B2 | 1/2002 | Miyazaki et al. |
| 6,369,445 B1 | 4/2002 | Khoury |
| 6,388,264 B1 | 5/2002 | Pace |
| 6,462,421 B1 | 10/2002 | Hsu et al. |
| 6,496,026 B1 | 12/2002 | Long et al. |
| 6,515,870 B1 | 2/2003 | Skinner et al. |
| 6,555,918 B2 * | 4/2003 | Masuda et al. ............. 257/777 |

FOREIGN PATENT DOCUMENTS

| | | |
|---|---|---|
| JP | 57-31166 A1 | 2/1982 |
| JP | 58-178529 | 10/1983 |
| JP | 60-194548 | 3/1984 |
| JP | 61-029140 | 2/1986 |
| JP | 61-101067 | 5/1986 |
| JP | 61-120454 | 6/1986 |
| JP | 61-137335 | 6/1986 |
| JP | 61-255046 | 11/1986 |
| JP | 63-18654 | 1/1988 |

| | | | | | |
|---|---|---|---|---|---|
| JP | 63-311732 A | 12/1988 | WO | WO-89-12911 | 12/1989 |
| JP | 62-226307 | 3/1989 | WO | WO-94-03036 | 2/1994 |
| JP | 60-77446 | 10/1989 | WO | WO-03/019654 | 3/2003 |
| JP | 2-220468 | 9/1990 | | | |
| WO | WO-89-10005 | 10/1989 | * cited by examiner | | |

STACKED PACKAGES

CROSS-REFERENCE TO RELATED APPLICATIONS

The present application claims benefit of U.S. Provisional Patent Application No. 60/328,038, filed Oct. 9, 2001, the disclosure of which is hereby incorporated by reference herein.

BACKGROUND OF THE INVENTION

Semiconductor chips typically are thin and flat, with relatively large front and rear surfaces and small edge surfaces. The chips have contacts on their front surfaces. Typically, chips are provided as packaged chips having terminals suitable for connection to an external circuit. Packaged chips typically are also in the form of flat bodies. Ordinarily, the packaged chips are arranged in an array on a surface of a circuit board. The circuit board has electrical conductors, normally referred to as "traces" extending in horizontal directions parallel to the surface of the circuit board and also has contact pads or other electrically conductive elements connected to the traces. The packaged chips are mounted with their terminal-bearing faces confronting the surface of the circuit board and the terminals on each packaged chip are electrically connected to the contact pads of the circuit board.

Memory chips typically are mounted in this manner. An unpackaged memory chip typically has numerous data contacts and one or a few select contacts. The chip is arranged to ignore data or commands appearing at the data terminals unless the appropriate signals are applied to the select contact or contacts. A conventional packaged memory chip has data terminals connected to the data contacts and has select terminals connected to the select contacts. In a conventional system, numerous identical packaged memory chips can be connected in an array with the corresponding data terminals of the various packaged chips connected to common traces and with the select terminals of the various chips connected to unique conductors, so that each conductor is associated with one, and only one, chip. Data can be written onto an individual chip by supplying the data on the common traces and by applying a selection signal on the unique trace associated with the particular chip where the data is to be written. The remaining chips will ignore the data. The reverse process is employed to read data from a particular chip. Such a circuit can be built readily using the conventional horizontal chip array and using identical chip packages for all of the chips in the array.

In the conventional arrangement, the theoretical minimum area of the circuit board is equal to the aggregate areas of all of the terminal-bearing surfaces of the individual chip packages. In practice, the circuit board must be somewhat larger than this theoretical minimum. The traces on the circuit board typically have significant length and impedance so that appreciable time is required for propagation of signals along the traces. This limits the speed of operation of the circuit.

Various approaches have been proposed for alleviating these drawbacks. One such approach is to "stack" plural chips one above the other in a common package. The package itself has vertically-extending conductors that are connected to the contact pads of the circuit board. The individual chips within the package are connected to these vertically-extending conductors. Because the thickness of a chip is substantially smaller than its horizontal dimensions, the internal conductors can be shorter than the traces on a circuit board that would be required to connect the same number of chips in a conventional arrangement. Examples of stacked packages are shown, for example, in U.S. Pat. Nos. 5,861,666; 5,198,888; 4,956,694; 6,072,233;and 6,268, 649. The stacked packages shown in certain embodiments of these patents are made by providing individual units, each including a single chip and a package element having unit terminals. Within each unit, the contacts of the chip are connected to the unit terminals. The units are stacked one atop the other. Unit terminals of each unit are connected to the corresponding unit terminals of other units. The connected unit terminals form vertical conductors of the stacked package, also referred to as buses.

However, providing a circuit with individual select connections in a stacked package introduces additional complexities. Because the vertical conductors extend through the terminals of the various units, the interconnections between the contacts of the chip and the unit terminals of each unit in the stack should be different in order to provide connections to unique vertical conductors. For example, in a four-chip stack having four vertical buses for carrying selection signals, the bottom unit may have a select contact of its chip connected to a unit terminal that forms part of bus number 1; the next unit may have a corresponding select contact of its chip connected to a terminal that forms bus number 2; and so on. This need for customization of the units adds complexity to the manufacturing process. For example, U.S. Pat. No. 4,956,694 describes units having chip carriers with a set of intermediate terminals in each unit. These intermediate terminals are connected to the contacts on the chip and are also connected to the terminals of the unit. The interconnections are made by wire bonds. The pattern of wire bonds differs from unit to unit. This arrangement inherently requires a relatively large chip carrier, which adds to the cost and bulk of the package. Moreover, the manufacturer must handle and stock multiple different wire bonded units. Sugano et al., U.S. Pat. No. 5,198,888, uses individualized chip carriers in the various units. These chip carriers have leads defining different interconnect patterns for the select contacts and the associated terminals. This, again, adds to the cost and complexity of the manufacturing process. U.S. Pat. Nos. 6,268,649 and 6,072,233 use customized units as well. It would be desirable to reduce the cost and complexity associated with providing customized units in a stacked package.

It would also be desirable to provide a compact stacked package and to provide a stacked package with good heat transfer from the chips within the stack to the external environment as, for example, to the circuit board or to a heat spreader overlying the top of the package. Further, it would be desirable to provide such a package using readily-available equipment and using components that can be fabricated readily.

SUMMARY OF THE INVENTION

One aspect of the invention provides semiconductor chip assemblies incorporating a plurality of units. Each unit desirably includes a semiconductor chip having at least one select contact and a plurality of other contacts and also includes a circuit panel having a plurality of chip select terminals and a plurality of other terminals, as well as traces extending on or in the panel. The traces are electrically connected between the contacts of the chip and the terminals. The trace electrically connected to each chip select contact of the chip desirably is a multi-branched trace including a common section connected to the select contact of the chip and also including a plurality of branches connected to different ones of the chip select terminals on the circuit panel. In the assembly, desirably at least one branch, but less than all of the branches of each such multi-branch trace, have an interruption therein so that the select contact is connected to less than all of the chip select terminals on the panel and most preferably so that each chip select contact is connected to only one chip select terminal of the panel in the unit. The units are disposed one above the other in a stack of superposed units. The assembly further includes vertical conductors, each connecting the corresponding terminals of the units in the stack to one another so as to form a plurality of vertical buses. Due to the selective connections within individual units provided by the multi-branch traces and interrupted branches, the chip select contacts of chips in different units are electrically connected to different ones of the vertical buses. This arrangement provides selective routing of chip select signals and other signals which must be conveyed to individual chips. The remaining contacts on each chip are connected in parallel with corresponding contacts on chips in other units so that signals can be conveyed to the remaining contacts of the various chips in parallel. This provides the required selective routing.

Most preferably, the chips, traces and terminals of different units in the stack are identical to one another, except that different ones of the units have different branches of their multi-branch traces interrupted so that different chip select contacts of different units are connected to different terminals on the circuit panels of such units. Most preferably, the circuit panel of each unit includes a dielectric layer, desirably less than about 100 μm thick. The vertical spacing distance between corresponding features in adjacent ones of the units desirably is no more than about 250 μm and preferably no more than about 200 μm greater than the thickness of the chip in each unit. The assembly, thus, has a relatively low overall height.

The dielectric layer in each circuit panel may have a disconnection aperture or opening, and the interruptions in the branches of the multi-branch traces may be formed at such disconnection apertures. The disconnection apertures can be formed in the dielectric layers when the units are manufactured or when the branches are interrupted, typically at a later stage in the process. In one arrangement, the circuit panel of each unit has edges, and the disconnection apertures are provided in the form of notches extending inwardly from one or more of the edges. The terminals of such a unit may include an outer row disposed adjacent to an edge of the circuit panel and the branches of the multi-branch traces may have portions extending outwardly to or beyond the outer row of terminals. In this instance, the notches need not extend inwardly beyond the outer row of terminals, so that the interruptions in the multi-branch leads can be formed readily.

A further aspect of the invention provides methods of making a semiconductor chip assembly. A method according to this aspect of the invention includes the step of providing a plurality of units. Here again, each unit desirably includes at least one semiconductor chip having at least one chip select contact and a plurality of other contacts and also includes a circuit panel having chip select terminals, other terminals and traces extending on or in the panel connected to the terminals. As discussed above, at least one trace of each panel desirably is a multi-branch trace including a common section and plural branches connected to different ones of the chip select terminals, and the contacts of the at least one chip in each unit desirably are connected to the traces of the circuit panel in that unit so that the chip select contacts are connected to the common sections of the multi-branch traces. The method according to this aspect of the invention desirably includes the step of selectively interrupting the branches of the multi-branch traces so that the common section of a multi-branch trace in each unit is connected to less than all of the chip select terminals of that unit. The method preferably includes the step of stacking the units and interconnecting terminals of different units to one another to form vertical buses.

The selectively interrupting step desirably is performed so that the chip select terminals of chips in different units are connected to different ones of the vertical buses. Most preferably, prior to the step of selectively interrupting the multi-branch traces, the units are substantially identical to one another. The step of selectively interrupting the multi-branch traces may be performed at any time during or after formation of the units. In one arrangement, the step of providing the units includes connecting the chips to the traces using a tool such as a thermosonic bonding tool, and the step of selectively interrupting the branches is performed by engaging the same tool with the branches as part of the same processing operation.

In another arrangement, the step of selectively interrupting the branches is performed later as, for example, just prior to the stacking step. Thus, the units may be provided as substantially identical elements which may be handled and stocked as mutually interchangeable parts. Here again, the dielectric layers of the various units may include interruption openings extending through the dielectric layers, and the branches of the multi-branch traces may extend across these interruption openings prior to the severing step. The step of selectively interrupting the branches may include breaking the branches at these interruption openings. Alternatively, the interruption openings may be formed at the same time as the branches are broken as, for example, by removing small regions of each multi-branch trace and portions of the dielectric layers underlying these regions, such as by punching the circuit panels to form the interruption openings while also breaking the branches of the traces.

Because the units are substantially identical to one another and can be treated as parts interchangeable with one another up to and including the step of severing the branches, handling and stocking of the units in commerce is substantially simplified. For example, the units can be fabricated at a chip packing plant arranged to handle bare semiconductor chips and to mount the bare semiconductor chips to the circuit panels of the individual units. The stacking operation can be performed in a circuit board stuffing plant having tools and equipment adapted for surface-mounting packaged chips to circuit boards. Indeed, the stacking operation can be performed concomitantly with mounting the assembly to a circuit board. For example, the units can be stacked and the solder balls joining the various units can be reflowed at the same time as the solder balls joining the bottom unit in the stack to the circuit board are reflowed.

A further aspect of the invention provides an in-process collection of interchangeable semi-finished units usable in a stacking process and assembly as discussed above.

A further aspect of the invention provides additional semiconductor chip assemblies. A chip assembly according to this aspect of the invention also includes a plurality of units, each including a semiconductor chip having contacts on a front surface, and including a circuit panel having a central region and a peripheral region. The panel desirably includes a dielectric layer having first and second surfaces and at least one bond window extending between the first and second surfaces in the central region. The panel also includes a plurality of terminals in the peripheral region, the terminals being exposed at both the first and second surfaces. Preferably, the dielectric layer has a plurality of terminal apertures extending between the first and second surfaces in the peripheral region and the terminals are pads aligned with the terminal apertures. The chip is disposed with the front surface of the chip facing toward a surface of the panel in the central region and the contacts of the chip are connected to the traces on the panel in the at least one bond window. The units are superposed on one another in a stack so that the rear surface of a chip in one unit faces toward a surface of the dielectric layer in a next adjacent unit. The units most preferably bear on one another in at least those portions of the central regions occupied by the traces. A plurality of conductive masses are disposed between the terminals of the units and connect the terminals of the adjacent units to one another.

In one arrangement, the traces of each unit extend along the first surface of the dielectric layer in that unit, and the front surface of the chip in each unit faces toward the second surface of the dielectric layer in that unit. In a chip assembly of this type, at least some of the units desirably include heat transfer layers overlying the traces of such units, and these units bear on one another through the heat transfer layers. Thus, the heat transfer layer of each such unit desirably abuts the rear surface of the chip in the next adjacent unit. The heat transfer layers of these units desirably extend across the bond windows in the dielectric layers of these units and are substantially flat, at least in the region extending across the bond windows. Such units desirably further include an encapsulant at least partially filling the bond windows. During manufacture, the heat transfer layers may serve as masking layers which confine the encapsulant so that the encapsulant does not protrude beyond the dielectric layer. As further discussed below, the flat heat transfer layers allow close engagement of the units with one another and good thermal contact between adjoining units. These features contribute to the low height of the assembly and promote effective heat dissipation from chips within the assembly.

In an assembly according to a further aspect of the invention, the heat transfer layer may be present or may be omitted, but the encapsulant defines a surface substantially flush with the first surface of the dielectric layer or recessed relative to such surface. Where the heat transfer layer is omitted, the dielectric layer of each unit may bear directly on the rear surface of the chip in the next adjoining unit.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
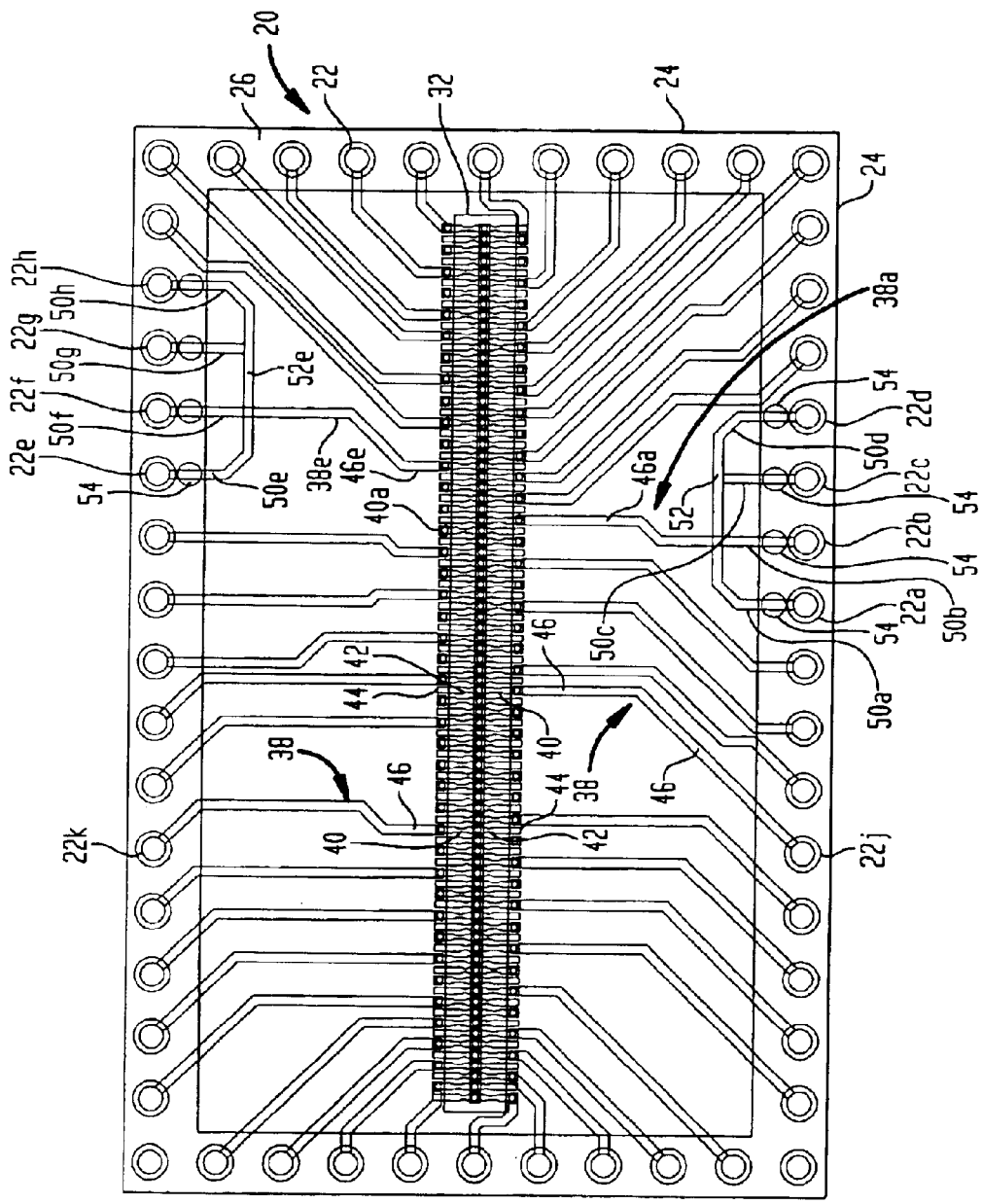
FIG. 1 is a top plan view of a circuit panel used in one embodiment of the invention.

A package in accordance with one embodiment of the invention uses a plurality of package elements 20, each such element being in the form of a circuit panel. Each such circuit panel may include a dielectric layer in the form of a thin, flexible dielectric tape as, for example, a layer of reinforced or unreinforced polyimide, BT resin or the like on the order of 25–100 $\mu$m thick, most preferably 25–75 $\mu$m thick. Alternatively, each panel may include a dielectric such as a fiberglass-reinforced epoxy as, for example, an FR-4 or FR-5 board. The panel has numerous terminals 22 disposed in rows within a peripheral region of the panel, adjacent the edges 24 of the panel. In the embodiment illustrated, rows of terminals are provided along all four edges. However, the terminals can be provided adjacent less than all of the edges as, for example, in two rows adjacent to two opposite edges of the panel. Each terminal 22 may be in the form of a flat, relatively thin disc of copper or other suitable metallic material on a first surface 26 of the panel (the surface visible in FIG. 1). As best seen in FIG. 2, the panel also has holes 28 extending through it in alignment with terminals 22. Each such hole extends between the first surface 26 of the panel and the opposite, second surface 30.

Each panel 20 further has an elongated bond window 32 extending adjacent the center of the panel. The panel further has a large number of leads 36. Each lead includes a trace 38 extending along the first surface 32 of the panel and a connection section 40 formed integrally with the trace projecting from the trace across the bond window. In the unassembled state depicted in FIG. 1, each connection section is connected by a frangible element 42 to an anchor section 44 projecting from the side of the bond window opposite trace 38. The traces and anchor portions are arranged in a row extending along the length of the bond window. Different traces extend to opposite sides of the bond window, so that some of the connection sections 40 project into the bond window from one side, whereas others project into the bond window from the opposite side. The arrangement of the traces and their connection sections may be substantially as shown in U.S. Pat. No. 5,489,749, the disclosure of which is hereby incorporated by reference herein.

The terminals 22 include a first set of select terminals 22A–22D; a second set of select terminals 22E–22H; as well as other terminals, referred to herein as non-select terminals, as, for example, terminals 22J and 22K. Each trace 38 includes a common section 46 adjacent to and connected to a connection section 40. Some of the traces are connected to the non-select terminals. These traces have common sections 46 which extend all the way to the associated terminals, such as to terminals 22J and 22K, so that the common section 46 of each such trace is connected directly with a non-select terminal.

Those traces 38 associated with the select terminals are multi-branched traces 50. Each such multi-branched trace has a plurality of branches connected to its common section 46 and connected to one of the associated select terminals. For example, trace 38A includes branch 50A connected to select terminal 22A; branch 50B connected to select terminal 22B; branch 50C connected to select terminal 22C; and branch 50D connected to select terminal 22D. Trace 38A also includes a distribution section 52A extending transverse to the common section 46A and interconnecting the various branches 50A–50D with the common section. Trace 38E associated with terminals 22E–22H is also a multi-branched trace and has a similar set of branches 50E–50H and distribution section 52E, so that all of the branches 50E–50H are connected to the common section 46E of the trace and to its connection section 40E. The dielectric of panel 20 has disconnection apertures 54 aligned with the branches 50 of each multi-branched trace 38, so that each such branch extends across a disconnection aperture. The disconnection apertures are disposed adjacent to the select terminals 22A, 22B, etc.

The terminals and the leads, including the traces and connection sections, are formed as a single layer of metallic features on the first surface of the panel. These metallic features desirably are less than about 30 µm thick, typically about 5–25 µm thick as, for example, about 20 µm thick. A thin adhesive layer (not shown) optionally may be provided between the dielectric layer 20 and the metal layer. This adhesive layer should also be as thin as practicable, desirably about 15 µm or less thick. The terminals and traces can be formed by conventional processes used in manufacture of tape automated bonding tapes and the like as, for example, by etching a laminate including a layer of copper or other metal and the dielectric material which forms the panel so as to remove portions of the metallic layer. Alternatively, the terminals and traces can be formed by a deposition process such as electroless plating and/or electroplating. The bond window, the holes associated with the terminals and the disconnection apertures may be formed by etching or ablating the dielectric material.

The stacked chip assembly includes a plurality of units 56 (FIG. 2). Except as otherwise stated, each unit 56 is identical to each other unit 56 in the stack. Each such unit includes a panel or chip carrier 20 as discussed above with reference to FIG. 1 and a chip 58 associated with that panel. Each such chip has a front or contact bearing surface 60 and a rear surface 62. The front surface 60 of each chip has contacts 64 arranged in rows adjacent the center of the chip. The chip also has edges 66 bounding the front and rear surfaces 62. The thickness t of the chip (the dimension between the front surface 60 and back surface 62) typically is substantially smaller than the other dimensions of the chip. For example, a typical chip may be about 100–500 microns thick and may have horizontal dimensions (in the plane of the front and rear surfaces) of about 0.5 cm or more. The front surface 60 of the chip faces towards the second surface 30 of the associated panel 20.

A layer of adhesive 68 is disposed between the chip and the panel of each unit. The adhesive layer 68 defines an aperture in alignment with the bond window. Adhesive layer 68 may be provided by applying a liquid or gel material between the chip and the panel at the time of assembly or by providing a porous layer such as an array of small resilient elements between the layers and injecting a flowable material into such layer as taught, for example, in certain embodiments of U.S. Pat. Nos. 5,659,952 and 5,834,339, the disclosures of which are hereby incorporated by reference herein. Preferably, however, the adhesive layer is provided as one or more solid or semi-solid pads having substantially the same horizontal extent as the desired adhesive layer in the final product. These pads are placed between the chip and panel during assembly. For example, the pad may be pre-assembled to the panel or to the chip before the chip is juxtaposed with the panel. Such a solid or semi-solid pad can be placed quite accurately in relation to the chip and the panel. This helps to assure that the pad does not cover terminals 22, even where there is only a small clearance between the nominal position of the pad edge and the terminals. Such a pad may include an uncured or partially cured layer and other adhesion-promoting features as discussed, for example, in U.S. Pat. No. 6,030,856, the disclosure of which is hereby incorporated by reference herein. Alternatively or additionally, the pad may be provided with a thin layer of a flowable adhesive on one or both surfaces, and this layer may be a non-uniform layer as described in U.S. Pat. No. 5,548,091, the disclosure of which is hereby incorporated by reference herein, to help prevent gas entrapment in the layer during assembly. Adhesive layer 68 desirably is as thin as practicable as, for example, about 10–125 µm thick, most preferably about 25–75 µm.

The chip 58 of each unit is aligned with the central region of the associated panel, so that the rows of contacts 64 are aligned with the bond window 32 in the panel. The connection section 40 of each lead is connected to a contact 64 of the chip. During this process, the connection section of each lead is detached from the anchor section 44 of the lead by breaking the frangible section 42 of the lead. This process may be performed as described in the aforementioned U.S. Pat. No. 5,489,749 by advancing a tool (not shown) such as a thermal, thermosonic or ultrasonic bonding tool into the bond window of the panel in alignment with each connection section so that the tool captures the connection section and forces it into engagement with the appropriate contact. The common section 46 of the trace 38 in each lead (FIG.

1) is connected by a connection section 40 to a contact on the chip. The arrangement of the contacts and connection sections is selected so that the common sections 46A and 46E of multi-branched traces 38A and 38E are connected to select contacts on the chip, i.e., to contacts of the chip which are not to be connected in parallel with corresponding contacts on all of the other chips in the stack. The common sections of the other traces are connected to the non-select contacts, i.e., contacts of the chip which are to be connected in parallel with corresponding contacts of the other chips in the stack.

Each unit 56 further includes a solder mask layer 74 (FIG. 2) overlying the traces and terminals in the peripheral region of the panel. The solder mask layer has apertures aligned with the terminals 22. The solder mask layer can be applied as a conformal coating or sheet by conventional processes. Each unit further includes a heat transfer layer 76 overlying the traces 38 and the first surface 26 of the panel in the central region of the panel aligned with the chip 58. As further discussed below, the heat transfer layer will establish intimate contact with the rear surface of the chip in the next adjacent unit of the stack. The heat transfer layer may be formed from a material such as a gel or grease loaded with a thermally conductive filler, or from a material which can be brought to a deformable condition during assembly as, for example, a thermoplastic material or an uncured or partially cured epoxy or other reactive resin. Desirably, the heat transfer layer is a dielectric material and hence does not electrically short the various traces to one another. The heat transfer layer may be formed integrally with the solder mask layer so that a central portion of the solder mask layer, aligned with chip 58, forms the heat transfer layer.

The heat transfer layer, whether formed integrally with the solder mask layer or separately from the solder mask layer, desirably is as thin as practicable as, for example, about 40 μm thick or less, and desirably about 30 μm thick or less. An integral solder mask layer and heat transfer layer may be provided as a conformal coating having a thickness of about 5–20 μm in those regions of the coating overlying the traces and about 10–40 μm thick in those regions disposed between the traces. Such a coating adds only about 5–20 μm to the overall thickness of the unit. As seen in FIG. 2, the central portion of the heat transfer layer or solder mask layer bridges across the aperture 32 in the dielectric layer. Preferably, the central portion of the heat transfer layer or solder mask layer is substantially planar, and does not bulge substantially away from dielectric layer 20.

An encapsulant 33 may be provided in aperture 32, surrounding the connection sections 40 of the leads. The encapsulant may be separate from the adhesive layer 68 and may be introduced using the techniques disclosed in U.S. Pat. Nos. 6,232,152 and 5,834,339, the disclosures of which are incorporated by reference herein. As disclosed in certain preferred embodiments taught in the '152 and '339 patents, the layer attaching the chip to the dielectric layer (adhesive layer 68) may define a channel extending to one or both edges of the chip, and the encapsulant may be introduced into this channel at the edges of the chip. Alternatively, where the adhesive layer is formed in whole or in part by a flowable material introduced between the chip and the dielectric layer as discussed above, the encapsulant may be formed by the flowable material. In either process, the heat transfer layer 76 (or internal heat transfer and solder mask layer) covers the bond window in the dielectric layer so that the encapsulant cannot project beyond the first surface 76 of the dielectric layer.

During assembly of each unit, some of the branches of each multi-branched trace are broken so as to disconnect the terminals associated with those particular branches from the common section of the multi-branched trace. Preferably, all but one branch of each multi-branched trace is broken, leaving only one select terminal connected to the common section of each multi-branched trace. The branches may be broken by advancing a tool into the disconnection apertures 54 associated with the branches to be broken. The tool may be the same tool used to perform the bonding operation on the connection sections of the leads. To facilitate the breaking operation, the branches may be provided with frangible sections weaker than the remainder of the branch, such as narrowed sections (not shown), in alignment with the disconnection apertures. During the breaking process, the terminals 22 adjacent to the branches to be broken serve as anchors for the branches so that the branches tend to break rather than becoming detached from the dielectric of panel 20. The broken ends of the branches are not connected to any portion of the chip. The adhesive layer 68 preferably does not include apertures aligned with the disconnection apertures and the broken ends of the branches become buried in the adhesive. Alternatively, the broken ends of the branches may contact the dielectric passivation layer (not shown) on the surface of the chip.

Different units have different ones of the branches connected to terminals after the breaking step. For example, in the four-unit assembly depicted in FIG. 2, the top unit 56A may have the common section 46A of multi-branched trace 38A connected only to terminal 22A of set 22A–22D and has the common section 46E of trace 38E connected only to terminal 22E of set 22E–22H. In the next unit 56B, common section 46A is connected only to terminal 22B whereas common section 46E is connected to terminal 22F. The next unit 56C has sections 46A and 46E connected to terminals 22C and 22G respectively, whereas the bottom unit 56D has the same common sections connected to terminals 22D and 22H.

The units are stacked one on top of the other as illustrated in FIG. 2. Each terminal 22 is connected to the corresponding terminal of the next adjacent unit via a solder ball 78. The solder balls 78 serve as conductive elements which join the corresponding terminals of the various units into vertical conductive buses. For example, terminal 22J (FIG. 1) of each unit is connected on the same vertical bus with the corresponding terminals 22J of the other unit. Each solder ball makes contact with the terminal of one unit through an aperture in the solder mask layer 74 and with a terminal of the other unit through an aperture 28 in the dielectric layer of the panel 20 in that unit. The heat transfer layer 76 (or the combined heat transfer and solder mask layer, where such a combined layer is employed) on each unit other than bottom unit 56D makes intimate contact with the rear surface 62 of the chip in the next lower unit in the stack. During assembly, the solder balls are partially or entirely melted or "reflowed". The solder mask layer 74 and the dielectric layers of the panels prevent spreading of the solder along the lengths of the traces 38 during the reflow operation. The heat transfer 76 layers may be momentarily softened during the assembly process to assure intimate contact. Alternatively, where the heat transfer layers are formed from an initially soft or flowable material such as a curable epoxy, the heat transfer layers may be cured during assembly after being brought into intimate contact with the chip of the next lower assembly.

Prior to assembly of the stack, the individual units can be tested in a test socket having contacts corresponding to the locations of the terminals. Typically, the solder balls are bonded to the terminals of each unit so that they project from the first surface 26 of the panel and the unit is tested with the solder balls in place. For example, the test socket may have openings adapted to engage the solder balls. Because all of the units have terminals and solder balls in the same pattern, the single test socket can be used to test all of the units.

The resulting package may be assembled to a circuit board using conventional surface mounting techniques. The solder balls 78 of the lower most unit 56D can be reflowed and bonded to contact pads 80 of a circuit board 82, partially depicted in FIG. 2. Thus, each vertical bus is placed in electrical contact with an individual contact pad 80 of the circuit board. The heat transfer layer 76 of the bottom unit 56D may be in contact with a feature of circuit board 82 as, for example, a large thermal pad 84. A metallic plate 86 may be provided as part of the package or mounted to the circuit board prior to assembly of the package. This plate serves as a heat conductor between the thermal layer 76 and the circuit board. Where the plate 86 is provided as a part of the package, the plate or the pad may carry a layer of solder (not shown) so that the plate is reflow-bonded to the pad 84 when the solder balls are bonded to the contact pads. Alternatively, the heat transfer layer 76 of the lower-most unit may be thick enough so that it makes direct contact with a feature of the circuit board itself. In a further variant, the heat transfer layer of the lower-most unit may be omitted.

The completed package provides numerous advantages. As discussed above, the select contacts of chips in different units are connected to different select terminals and therefore connected to different vertical buses. By routing selection signals to the contact pads of the circuit board associated with these buses, it is possible to apply a selection signal to a select contact in a chip of only one unit. The vertical buses formed by the interconnected solder pads are quite short and provide low electrical impedance. Also, the traces provide a relatively lower impedance path. Typical traces have an inductance of about 5 nanohenries or less. Moreover, signal propagation delays between the contact pads of the circuit board and the contacts of any given chip are nearly the same as the signal propagation delays between the contact pads of the circuit board and the contacts of any other chip in the package. The units can be made economically, using "single-metal", circuit panels having conductive features on only one side. The entire package has a height which is determined in part by the thicknesses of the individual chips. Merely by way of example, one package which incorporates four units, each having a chip about 125 microns thick, has an overall height of about 1.5 mm.

The low overall height of a package is due in part to the small thickness of the elements other than the chips which determine the spacing between adjacent chips in the stack. As discussed above, within the central region of each unit aligned with the chip of such unit, the unit desirably includes only the adhesive layer 68, the leads or traces 38 and the heat transfer or solder mask layer and, optionally, a further adhesive layer between the dielectric layer and the metallization forming the leads. The distance d between corresponding features of adjacent units as, for example, the distance d between the second surface 30 of the dielectric layer 20 in unit 56A and the corresponding surface of the dielectric layer in unit 56B will be equal to the thickness t of chip 58B disposed between these layers plus the aggregate thickness of the aforementioned layers constituting the central portion of each unit. Most preferably, the distance d between adjacent units is equal to the thickness t of the chip plus about 250 $\mu$m or less, most preferably about 200 $\mu$m or less. Still smaller distance d can be achieved when the various layers are selected to provide the minimum height.

Because the heat transfer layer or combined solder mask layer and heat transfer layer is substantially flat, it can make good, intimate contact with the rear surface of the chip. This helps to provide both a low overall height and good heat transfer between units. Heat evolved in the chips of units in the middle of the stack can be dissipated by heat transfer to adjacent units through the top or bottom of the stack and from the top or bottom of the stack to the environment as, for example, to the circuit board 82 or to the surrounding atmosphere. To assure good heat transfer, and to provide the minimum overall height, it is desirable to assure that the central region of each unit is brought into abutting contact with the chip in the next adjacent unit during the stacking and reflow operations. It is also desirable to assure that the units align with one another in the horizontal direction during the stacking and reflow process, using the self-centering action provided by the surface tension effects of the solder balls. If the height of the solder balls is selected to provide a nominal clearance of about 10–15 $\mu$m prior to reflowing, then upon reflowing the solder balls will initially align the units with one another and, additionally, the solder will collapse to bring the units into abutment with one another. Alternatively or additionally, the units may be pressed together during reflow to assure abutment, and may be aligned with one another using appropriate fixturing or robotic systems as, for example, systems equipped with robotic vision components.

In a variant of the assembly method discussed above, the units can be fabricated without breaking the branches 50 of the multi-branched traces. These units can be handled and stocked as interchangeable parts prior to assembly with one another and with the circuit board. The branches are broken in a separate operation, desirably immediately prior to assembly. Thus, the step of selectively interrupting the branches desirably is performed in the same production plant or facility as the step of stacking the units. The separate branch-breaking operation does not require the same degree of precision required for bonding the connection sections of the leads and hence can be performed by less-precise equipment. Moreover, the ability to handle and stock only one type of unit throughout the entire supply chain up to assembly simplifies handling and distribution. Thus, units having identical chips, traces and terminals, prior to breaking the branches, are interchangeable with one another and can be provided in bulk, as a collection of interchangeable semi-finished articles. As used in this context, the term "identical" refers to the nominal configuration of the chips, traces and terminals, without regard for unit-to-unit variations which necessarily occur in any manufactured article.

The stacking and branch-breaking operations desirably are performed in a production plant adapted for attaching packaged semiconductor chips, modules and other components to the circuit board, an operation commonly referred to in the industry as "board stuffing." Board stuffing plants which employ surface mounting technology are commonly equipped with facilities for handling and placing components onto the circuit board, and with reflow equipment for momentarily heating the circuit board with the components thereon to fuse solder or otherwise activate bonding materials between the components and the contacts of the circuit board. The stacking operation can be performed using substantially the same techniques and procedures used for mounting elements to circuit panels. Only the minimal additional operation of breaking the branches is required.

In yet another variant, the stacking operation can be performed concomitantly with assembly of the stack to the board. That is, the individual units can be stacked on the circuit board, one above the other and temporarily held in place on the board as, for example, by a temporary clamping fixture, gravity, by adhesion between units, by flux at the terminals, or by some combination of these. In this assembled condition, the solder balls or conductive elements 78 associated with the bottom unit 56d overly the contact pads of the circuit board and the solder balls of the other units overlies the terminals of the next lower unit in the stack. After stacking, the entire stack and circuit panel are subjected to a reflow operation sufficient to fuse the bottom solder balls to the contact pads of the circuit board and to fuse the solder balls of the other units to the terminals of the adjacent units. This reflow operation may be performed in conjunction with the reflow operation used to attach other components to the board.

Figure 2:
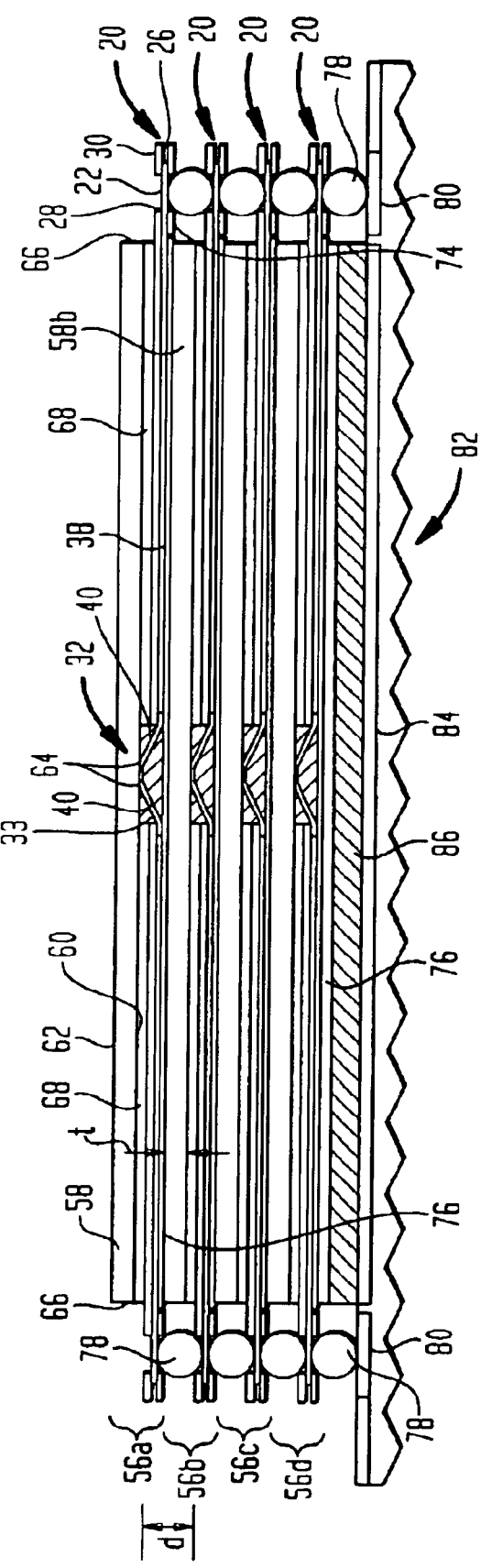
FIG. 2 is a diagrammatic elevational view of a stacked package using the circuit panel of FIG. 1.
Figure 3:
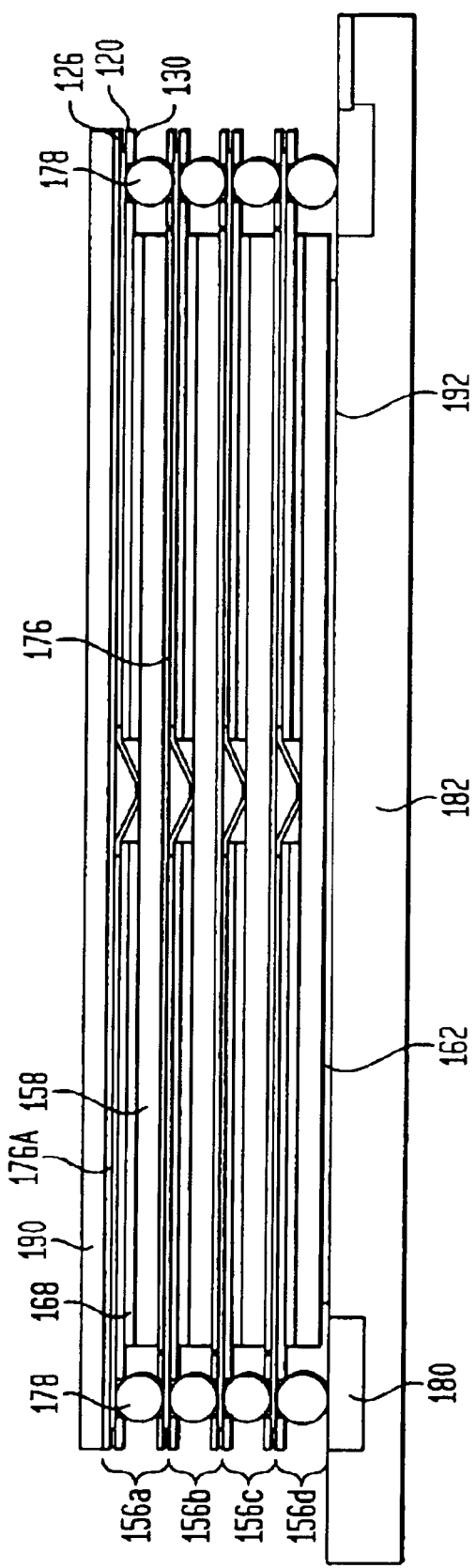
FIG. 3 is a diagrammatic sectional view of a stacked package in accordance with a further embodiment of the invention in conjunction with a circuit board.

A package according to a further embodiment of the invention depicted in FIG. 3 is similar to the embodiment of FIGS. 1 and 2 discussed above except that the units 156 are inverted so that the chip 158 incorporated in each unit is disposed towards the bottom of the unit whereas the circuit panel or package element 120 of each unit is disposed above the chip of that unit. Also, the solder balls 178 associated with each unit are disposed on the second or chip-facing side 130 of the panel rather than on the first or chip-remote side 126 of the panel. Stated another way, in this arrangement the solder balls are disposed on the same side of the panel as the chip. This arrangement provides lower overall height in the completed assembly.

A thermal spreader 190 is mounted to the top unit 156A, in contact with the heat transfer layer 176A of the top unit. The thermal spreader 190 may be formed from a metal or other thermally conductive material and may incorporate features such as ribs or fins (not shown) for dissipating heat into the surroundings. Also, the thermal spreader may have walls extending downwardly adjacent the edges of the package toward the circuit board 182 to promote the heat transfer between the spreader and the circuit board. The heat transfer layer 176 provided on the first or chip-remote surface 126 of the top most unit 156A conforms closely to the surface of the panel 120 in such unit and to the traces 156. As discussed above, this layer may be a dielectric layer to maintain electrical insulation between the traces of the top unit and the spreader. Alternatively or additionally, the solder mask layer 174 of the top-most unit may extend over the traces, into the central region of the panel to provide electrical insulation for the traces. Similar thermal conductive layers 176 are provided over the central regions of the panels in the other units. Here again, the solder mask layer or other dielectric layer can be used to insulate the traces if the heat transfer layer is electrically conductive. As discussed above in connection with FIGS. 1 and 2, these thermally conductive layers promote intimate contact and heat transfer between the various units in the stack. This, in turn enhances heat dissipation from the inner units of the stack.

Where solder balls 178 are provided on the same side of the tape as the chip, the solder balls may be surrounded wholly or partially by a stiffening layer (not shown) as disclosed in a co-pending, commonly assigned U.S. patent application Ser. No. 60/314,042, filed Aug. 22, 2001, and in the PCT international application claiming priority of same, Ser. No. PCT/US02/26805, the disclosures of which are hereby incorporated by reference herein. As disclosed in the '042 application, a stiffening layer can be formed by a flowable material as, for example, an epoxy or encapsulant such as an epoxy or encapsulant injected between the chip and the panel of a unit to form the adhesive layer 168. The stiffening layer extends towards the periphery of the panel and desirably surrounds the solder balls where the stiffening layer reinforces the panels for ease of handling during assembly. Because this layer is disposed outside of the central region, beyond the area occupied by the chips, it does not add to the height of the stack.

The rear surface 162 of the chip in the bottom unit 156D faces toward the circuit board 182. Rear surface 162 may be physically attached to the circuit board and placed in more intimate thermal communication with the circuit board by a thermal layer 192 provided between the rear surface of the chip and the board. Such a thermal layer may be formed from a thermally conductive material such as a gel or grease with a conductive filler or from a solder which is reflowed when the solder balls of the bottom unit are reflowed to attach the terminals to the contact pads 180 of the circuit board.

Figure 4:
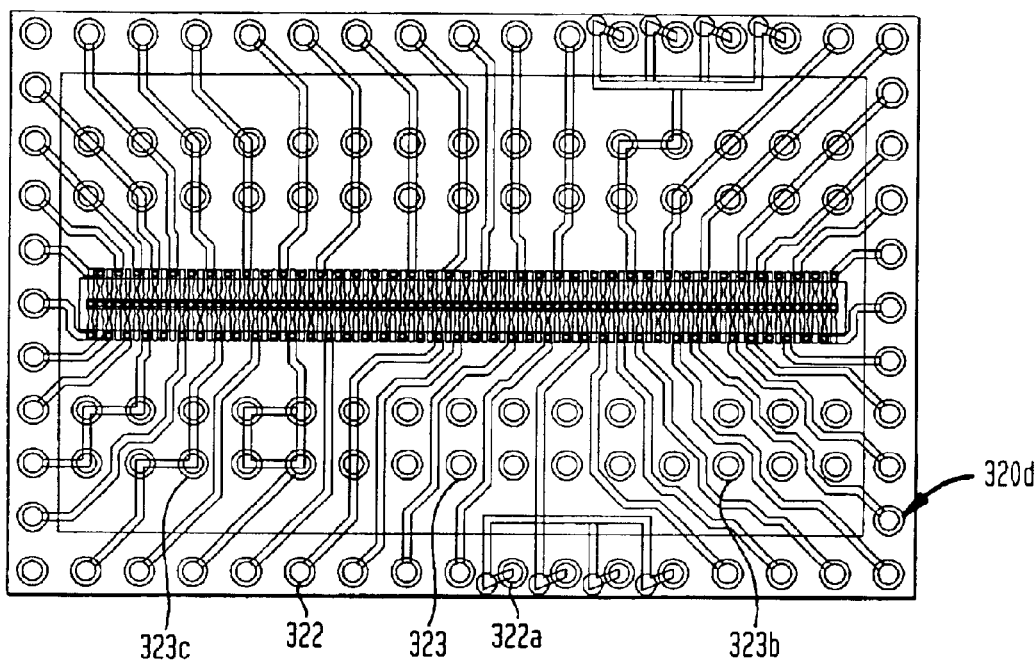
FIG. 4 is a view similar to FIG. 1, but depicting a circuit panel in accordance with a further embodiment of the invention.
Figure 5:
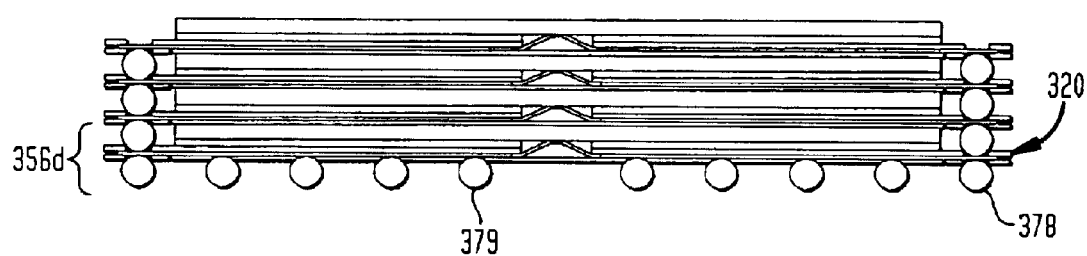
FIG. 5 is a view similar to FIG. 2, but depicting a stacked package using the circuit panel of FIG. 4.

The embodiment of FIGS. 4 and 5 is similar to the embodiment discussed above with reference to FIGS. 1 and 2 except that the panel or chip carrier 320 of the lower most unit is provided with additional "dummy" terminals 323. Here again, all of the terminals and traces are provided as elements of a single metallic layer. Dummy terminals 323 are disposed in an array extending over the central region of the panel 320D in the bottom unit 356D. This panel also has peripheral terminals 322 corresponding to the select terminals and non-select terminals discussed above with reference to FIG. 1. Solder balls 379 are provided on the dummy terminals in the same manner as solder balls 378 are provided on the other terminals. These solder balls serve as heat conductors between the bottom unit and the circuit board when the package is mounted on a circuit board. As best seen in FIG. 4, the dummy terminals 323 may be disconnected from the traces as shown for example at 323B. In this arrangement, the traces 338 are routed around the dummy terminals. Alternatively or additionally as shown at 323C, dummy terminals can be connected to the traces. This allows routing of the traces through the area occupied by the dummy terminals and hence simplifies layout of the traces on the panel.

Figure 6:
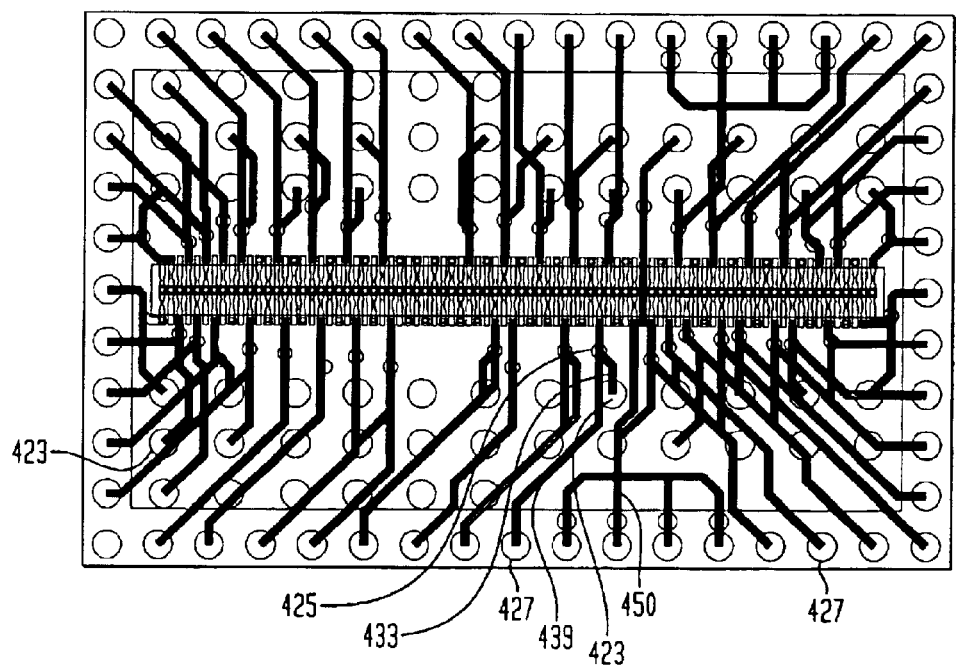
FIG. 6 is a diagrammatic plan view of a circuit panel used in yet another embodiment of the invention.
Figure 7:
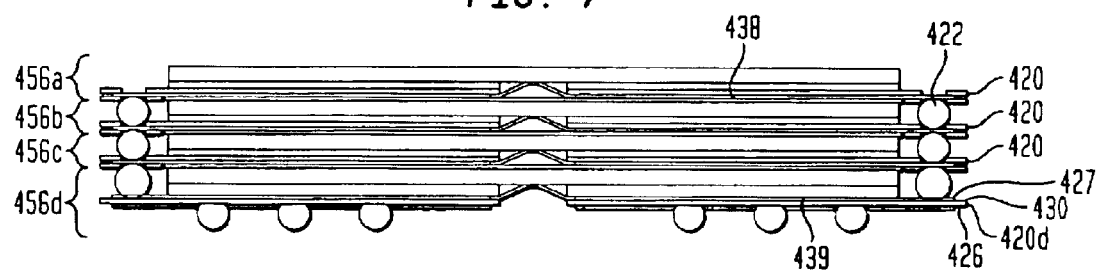
FIG. 7 is a diagrammatic sectional view of a stacked package made using the circuit panel of FIG. 6.

In the embodiment depicted in FIGS. 6 and 7, the panels 420 of all of the units 456 except the bottom unit 456D are identical to the panels discussed above with reference to FIGS. 1 and 2. Panel 420D of the bottom unit is a so called "two metal" panel having a layer of metallic features 430 on the second or chip-facing side of the panel as well as separate layer of metallic features on the first or chip-remote side. The layer of metallic features on the chip-facing side 430 includes peripheral terminals 425 and traces 439 corresponding to the terminals 422 and traces 438 of the other panels in the stack. These terminals and traces include terminals and traces essentially identical to the terminals and traces discussed above. The layer of metallic features on the first or chip-remote side 426 of the panel includes an array of board connection terminals 423 disposed in a rectilinear grid extending on the central region of the panel. This metallic layer also includes additional traces 433 extending from the board connection terminals 423 to vias 425. The vias 425 include holes extending through the panel and metallic structures such as via liners extending through these holes. Additional traces 433 are connected to traces 439 by the metallic features within the vias. When the package is mounted to the circuit board, the board connection terminals 423 are connected to the contact pads of the circuit board, thus connecting the traces 439 and peripheral terminals 425 to the circuit board. This in turn connects the vertical buses formed from the peripheral terminals 425 and the corresponding terminals 422 of the other panels with the contact pads of the circuit board. In a variant of this approach, each branch 450 of the multi-branched traces may be provided with a separate via 425 and linked to a separate interconnect trace 433 and board connection terminal 423.

Figure 8:
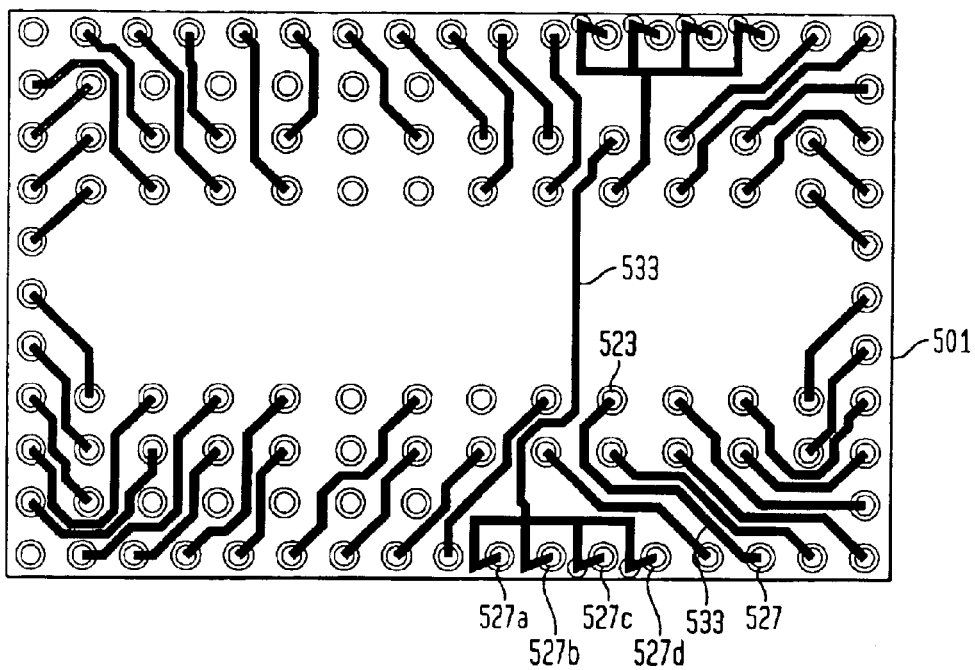
FIG. 8 is a diagrammatic plan view of a translation panel used in a further embodiment of the invention.
Figure 9:
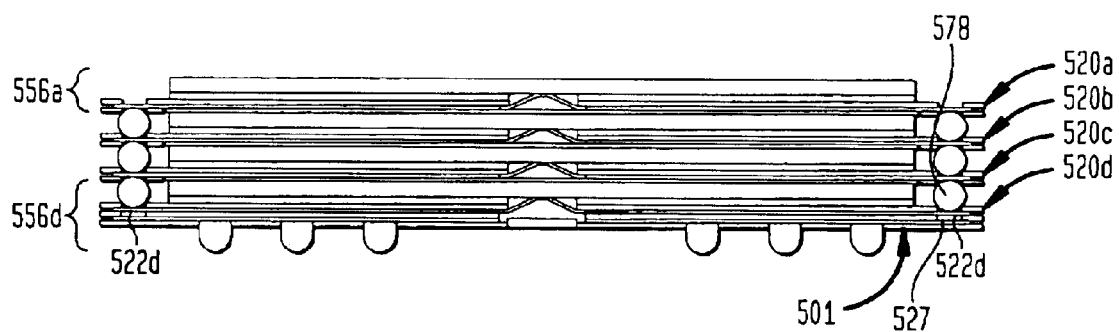
FIG. 9 is a diagrammatic sectional view of a package using the translation panel of FIG. 8.

The embodiment of FIGS. 8 and 9 uses panels 520 identical to the panels discussed above with reference FIGS. 1 and 2 in all of the units 556. However, the terminals 522D, 556D are not connected directly to the circuit panel thus, the terminals of this unit are not provided with solder balls projecting downwardly. A further circuit panel or translator 501 overlies the chip-remote or first surface of panel 520D. The translator has board connection terminals 523 disposed in a grid like pattern similar to the pattern of board connection terminals 423 discussed above with reference to FIGS. 6 and 7. The translator also has peripheral terminals 527 in a pattern corresponding to the pattern of terminals 522 on the panels of the various units and connection traces 533 interconnecting the connection terminals 523 with the peripheral terminals 527. The translator is juxtaposed with the panel of the lower most unit so that the peripheral terminals of the translator are aligned with the peripheral terminals 522D. Thus, each vertical bus defined by each set of aligned peripheral terminals on the various panels 520 is electrically connected with one peripheral terminal 527 of the translator and hence with one contact pad on the circuit board. This arrangement allows fabrication of a structure with a standard or grid like terminal pattern for mounting on the circuit board with only a single metal element. The terminals 522D of the bottom unit may be solder bonded to the peripheral terminals 527 of the translator when the solder balls 578 of the next lower unit are reflowed. In a variant, the translator may include separate connections to separate board connection terminals 523 associated with those peripheral terminals 527A–527D which will ultimately be connected to the buses associated with select terminals on the various units. This assures that each bus connected to select terminals will be connected to a unique contact pad on the circuit board.

In a further variant, the translator itself may include one or more semiconductor chips. For example, the translator may be a "bottom unit" of the type discussed in certain preferred embodiments of the co-pending, commonly assigned U.S. Provisional Patent Application Ser. No. 60/408,644, entitled "Components, Methods and Assemblies For Stacked Packages," filed on or about Sep. 6, 2002 and naming Kyong-Mo Bang as inventor, the disclosure of which is hereby incorporated by reference herein. As further discussed in the '644 application, such a bottom unit includes a bottom unit semiconductor chip and also includes top connections adapted to receive additional microelectronic devices. Such a bottom unit also may be mounted to a circuit board in a circuit board stuffing plant and additional microelectronic devices, such as a stacked assembly as discussed herein may be mounted to the top connections of the bottom unit. Merely by way of example, the bottom unit chip may be a microprocessor or other chip, whereas the chips in the stacked assembly mounted to the bottom unit may be memory chips which, in service, cooperate with the bottom unit chip.

Figure 10:
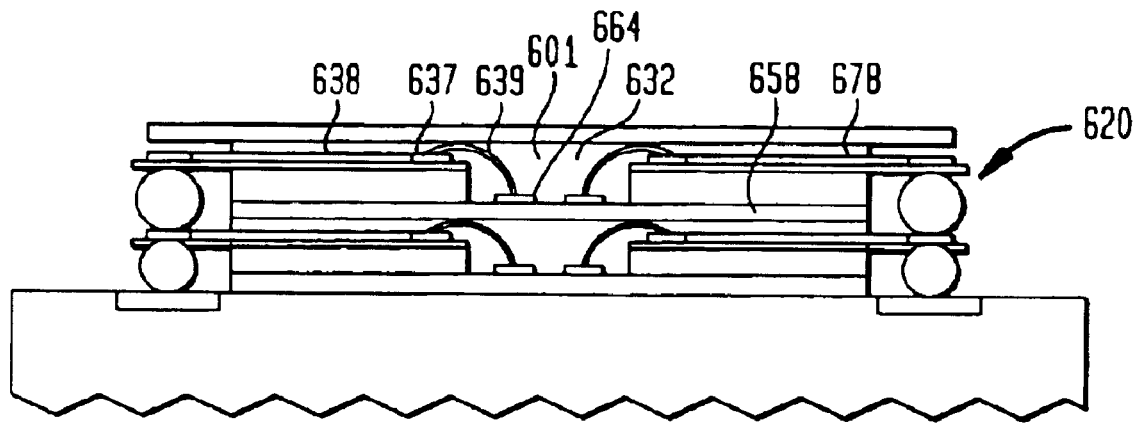
FIG. 10 is a diagrammatic sectional view of a stacked package according to a further embodiment of the invention.

The package illustrated in FIG. 10 is similar to the package shown in FIG. 3 except that the traces 638 of the panels 620 do not have integrally formed connection sections for bonding to the contacts 664 on the chip 658. Instead, the traces terminate in bonding pads 637 adjacent the bond window 632. Wire bonds 639 are provided between these bonding pads and the contacts 664 of the chip. Also, the package of FIG. 10 includes only two units rather than four units. Larger numbers and odd numbers of units also can be used in any of the foregoing structures. Wire bonded units also can be employed in the reverse orientation, i.e., with the chip of each unit disposed above the panel of the unit as discussed with reference to FIGS. 1 and 2. Also, an encapsulant 601 covers the wire bonds. The end caps may be integral with the thermally conductive layer 678 overlying the remainder of the unit.

Figure 11:
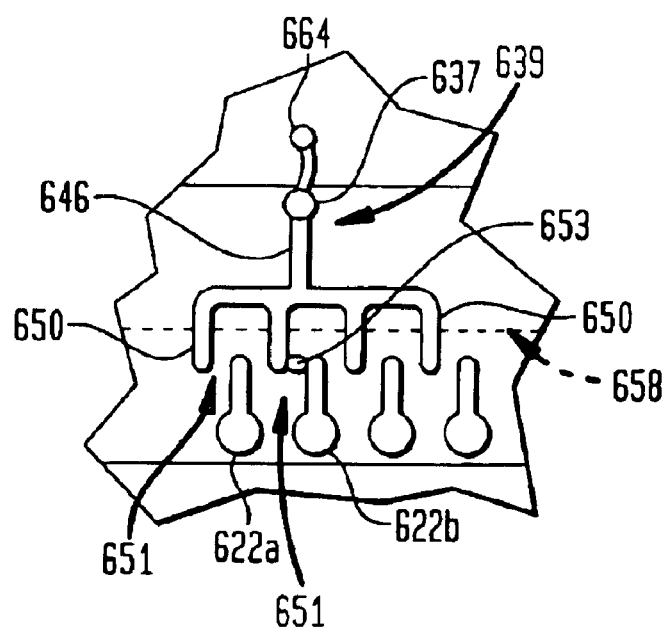
FIG. 11 is a fragmentary view of a portion of a package element in accordance with another embodiment of the invention.

In a further variant (FIG. 11), a multi-branched trace 639 has a common section 646 which is adapted for connection to the chip contact 664. The common section thus may have a bonding pad 637 for use with a wire bond connection to the contact or else may have a connection section which can be directly bonded to the contact. The branches 650 of the trace, when initially fabricated, do not extend in an unbroken, continuous path from the common section 646 to the various select terminals 622. Rather, each branch is initially fabricated with a gap 651. These gaps can be selectively closed as, for example, by applying a short wire bond 653 across the gap 651 of one branch. This embodiment is less preferred, as the additional wire bond introduces additional complexity and impedance and may lie above the plane of the surrounding panel. Desirably, the gaps in the branches are positioned in the peripheral region of the circuit panel, outside of the region occupied by the chip 658 (indicated in broken lines in FIG. 11), so that the wire bond 653 extending across the gap will lie outside of the area occupied by the chip. Thus, a protruding wire bond in one unit and an encapsulant which may optionally be applied over such a protruding wire bond may project vertically beside the chip in that unit or alongside the chip in the next adjacent unit and, thus, will not add to the overall height of the stacked assembly.

A unit in accordance with a further embodiment of the invention (FIG. 12) incorporates a circuit panel or dielectric element 720 generally similar to the elements discussed above and having numerous terminals 722 disposed thereon and connected to numerous leads 738. The terminals include a first outer row 723 incorporating terminals 722A–722F extending adjacent to a first edge 724 of the circuit panel. This row of terminals defines an inner border. Terminals 722 may include additional terminals as, for example, terminals 722G and 722H disposed further from the edge 724, as well as other terminals (not shown) on other parts of the circuit panel. The first outer row 723 defines an inner border 725 at the edge of the terminals furthest from the first edge 724 of the circuit panel, a center line 726 and an outer border 731 at the edge closest to edge 724.

Figure 13:
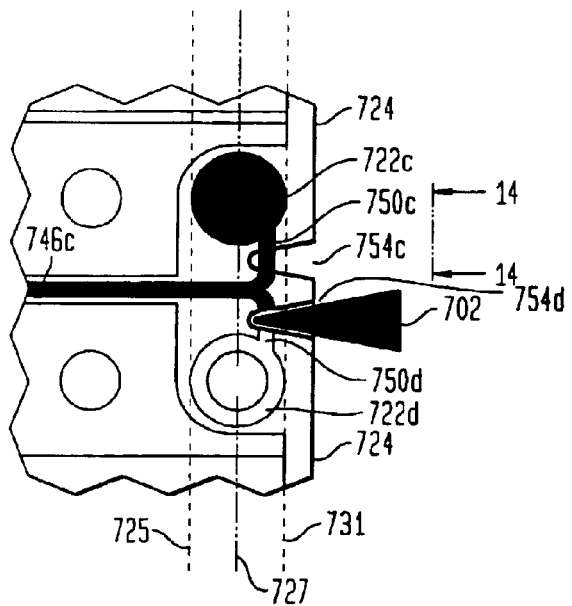
FIG. 13 is a fragmentary plan view on an enlarged scale of the unit shown in FIG. 12.

Terminals 722C and 722D form a set of chip select terminals associated with a multi-branched lead 738C having a common section 746C adapted for connection to a chip select contact 764 and also having branches 750C and 750D connected to the common section. Branch 750C connects the common section to a chip select terminal 722C, whereas branch 750D connects the common section 746C to another chip select terminals 722D. As best seen in FIG. 13, branches 750C and 750D extend close to the first edge 724 of the circuit panel 720. Desirably, the branches extend to within about 1 mm and preferably within about 0.5 mm or less of the first edge 724, and most desirably within about 200 microns or less of the first edge. Branches 750C and 750D are disposed outwardly of the inner border 725 of the first outer row of terminal 723 and are also disposed outwardly of the center line 727 of this row, near the outer border 731 of the row. The circuit panel 720 has disconnection openings 754C and 754D in the form of notches extending inwardly from first edge 724.

Figure 14:
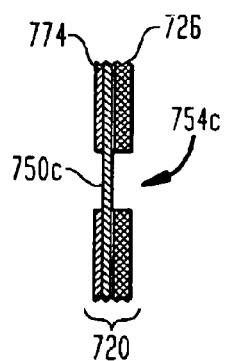
FIG. 14 is a fragmentary, sectional elevational view taken along line 14—14 in FIG. 13.

As best seen in FIG. 14, circuit panel 720 includes a structural dielectric layer 726 defining the bottom or inner surface of the circuit panel, a single layer of metallic features including the leads and terminals and, hence, including branch 750C, and a solder mask layer 774. The base dielectric layer 726 and solder mask layer 774 are interrupted in the disconnection openings or notches 754 such that the branch 750C bridges across the disconnection opening. Notches 754C and 754D extend inwardly from edge 724 to and slightly beyond branches 750C and 750D. Because the branches are disposed close to the edge, the notches need not extend far into the circuit panel from the edge. Desirably, the notches extend less than about 1.5 mm and more desirably less than about 1.0 mm into the panel. The same structure is provided at branch 750D and disconnection opening or notch 754D.

Figure 12:
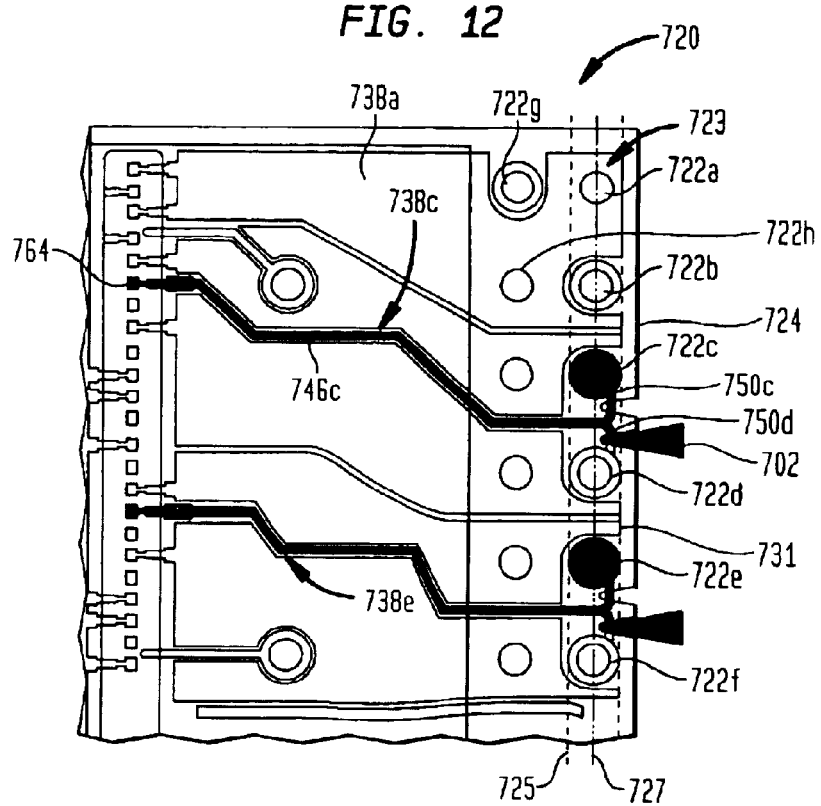
FIG. 12 is a fragmentary, diagrammatic plan view of a package unit in accordance with a further embodiment of the invention.

Thus, the branches 750 can be selectively broken by inserting a tool into the notch as, for example, a punch 702 (FIGS. 12 and 13) into the notches. The punch may be moved in a direction perpendicular to the plane of the circuit panel or parallel to the plane. A matching die having an opening shaped to closely conform to the punch may be provided beneath the circuit panel, and the punch may move downwardly through the notch into engagement with the die, breaking the branch lead in the process. Thus, branches 750C or 750D can be interrupted selectively so that the common section 746C of lead 738C can be connected selectively to either, both or neither of terminals 722C and 722D. An additional multi-branch lead 738E (FIG. 12) is associated with a similar pair of chip select terminals 722E and 722F and has a similar structure of branches and similar notches associated with the branches. As also seen in FIG. 12, some of the leads as, for example, lead 738A, are associated with two or more terminals 722A and 722H and permanently connected to these terminals. Also, lead 738A is a wide, planar structure covering a significant area on circuit panel 720. Further, some of the terminals are unconnected to leads. Such unconnected terminals may be provided, for example, to provide a symmetrical pattern of terminals and, hence, a symmetrical structure of vertical conductors in the finished assembly. Also, in addition to the various units, the assembly may include additional electrical elements disposed at the top of the stack or, indeed, at any location within the stack. The additional vertical conductors formed by unconnected terminals can serve as additional conductors extending to these elements.

Figure 15:
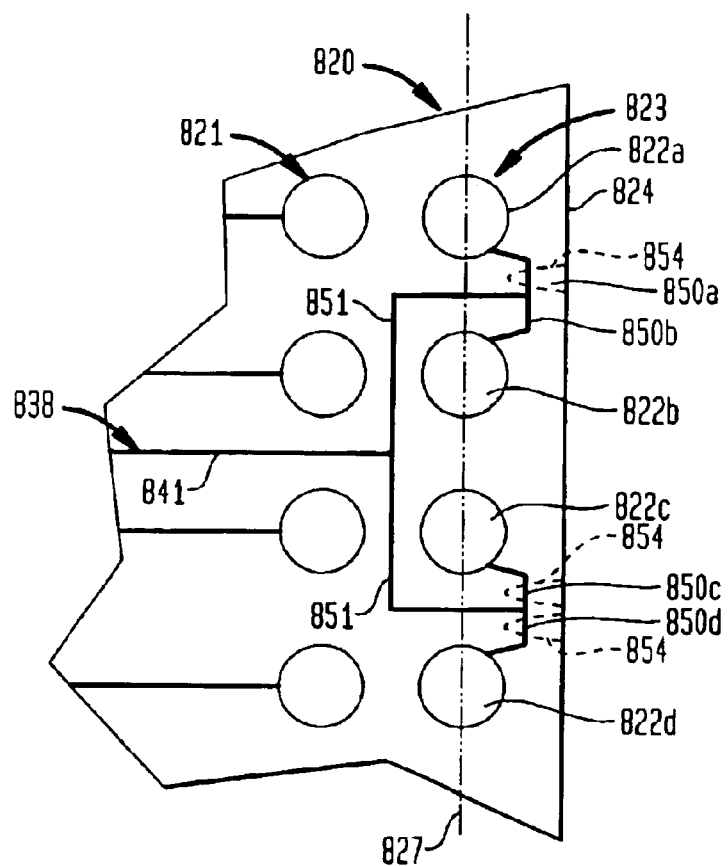
FIG. 15 is a fragmentary, diagrammatic plan view of a circuit panel in accordance with yet another embodiment of the invention.

The unit partially depicted in FIG. 15 has a circuit panel 820 having a first edge 824 and having a first row of outer terminals 823 extending alongside of edge 824, parallel to such edge, as well as an additional row 821 of terminals disposed inboard of the first outer row. A multi-branched lead 838 has a common section 846 and branches 850A, 850B, 850C and 850D extending to select terminals 822A, 822B, 822C and 822D, respectively. Branches 850 are connected to the common section 846 by intermediate sections 851. One such intermediate section connects branches 850A and 850B with the common section 846, whereas the other intermediate section connects branches 850C and 850D with the common section. Here again, the branches 850 extend in whole or in part outwardly beyond the center line 827 of the first outer row 823 of terminals. However, as initially manufactured and as connected in a semi-finished unit with a chip, the circuit panel does not have disconnection openings. Instead, branches 850 are selectively severed by forming notches 854 (seen in broken lines in FIG. 15) and breaking the branches during such notch formation. For example, the circuit panel may be selectively cut by a punch to form notches 854 where the branches are to be severed, but not form notches in other locations. For example, if notches 854 are formed in the pattern indicated in FIG. 15, branch 850B will remain unsevered and, hence, select terminal 822B will remain connected to the common portion 846 of lead 838, but the remaining select terminals will be disconnected. This operation desirably is performed, as discussed above, prior to stacking and most desirably in the same plant where the stacking is performed as, for example, in a circuit board stuffing plant.

Figure 16:
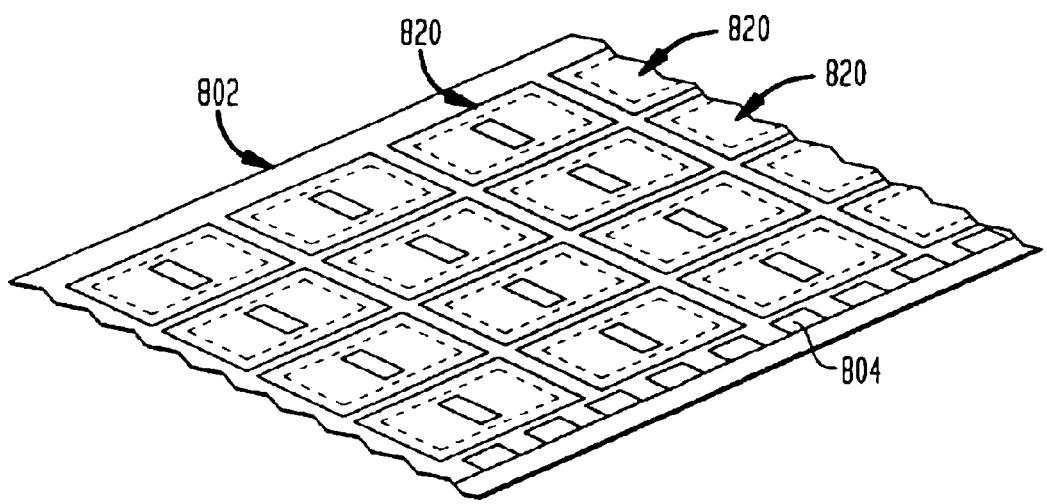
FIG. 16 is a fragmentary, diagrammatic perspective view of an in-process assemblage including a plurality of units formed using the circuit panels of FIG. 15.
Figure 17:
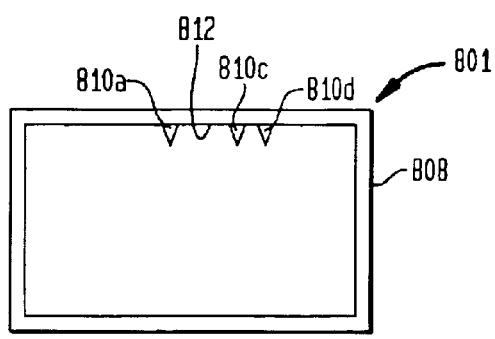
FIG. 17 is a diagrammatic elevational view of a cutting tool usable with the circuit panel and units of FIGS. 15 and 16.
Figure 18:
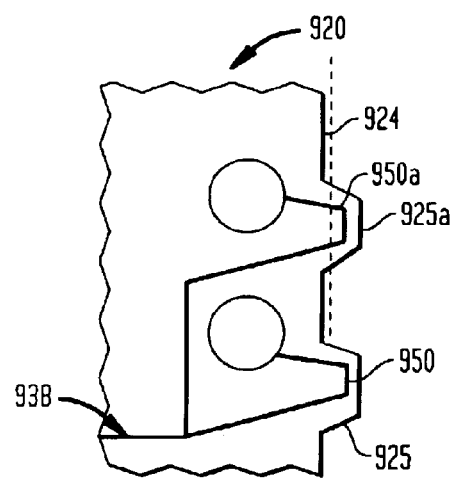
FIG. 18 is a fragmentary, diagrammatic plan view of a circuit panel in accordance with yet another embodiment of the invention.

As seen in FIG. 16, a large number of units may be provided as parts of a large sheet. Thus, one or more of the dielectric layers forming the circuit panels of the individual units form parts of continuous or semi-continuous dielectric layers extending throughout the sheet or tape 802. The sheet or tape may be provided with conventional registration features such as sprocket holes 804. Although the borders of the circuit panels forming the individual unit 820 are delineated in FIG. 16 for clarity of illustration, it should be appreciated that at this stage there may be no physical demarcation between adjacent units. The units are assembled in the manner discussed above by assembling semiconductor chips to the circuit panels of the individual units while leaving the units connected in the sheet 802. At this stage, all of the units are substantially identical with one another. The assembly of these identical units can be handled and stocked in sheet form. The individual units are severed from the sheet, desirably immediately prior to the stacking operation. During the severing operation, notches 854 (FIG. 15) are formed in each unit in a pattern corresponding to the desired pattern of notches for that unit. The notches formed in different units will be formed in different patterns. For example, a die 806 has a blade portion 808 in the form of a rectangle so as to cut each unit from adjacent units and has teeth 810 adapted to cut individual notches and sever individual branches 850 (FIG. 15). Teeth 810 are arranged to sever the branches in the pattern shown in FIG. 15. Thus, a tooth 810A is provided to sever branch 850A, and similar teeth 810C and 810D are provided to sever branches 850C and 850D. However, at a location 812 corresponding to branch 850B, no tooth is provided and, hence, this branch is not severed. The dies used to cut other units from the tape would have a different pattern of teeth. Other arrangements can be used for severing the units from the tape and concomitantly severing the branches to be used. For example, water jet, laser or other cutting devices may be used to cut individual units from the tape and also to sever the branches. Similar arrangements can be used with the other embodiments discussed above. For example, in those structures which have a pre-formed disconnection openings associated with the branches, the tool used to sever the unit from the sheet may have a projection arranged to pass into such a disconnection opening and sever the branch. In a further alternative, the branch-severing operation can be performed while the various units remain connected in a sheet, desirably immediately before severing the individual units from the sheet. The sheet optionally may be provided in the form of an elongated tape.

Figure 19:
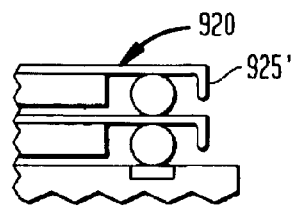
FIG. 19 is a fragmentary, diagrammatic elevational view of an assembly formed from the circuit panel of FIG. 18.

In yet another variant, the circuit panel 920 has an edge 924 with projections 925 extending outwardly from such edge. A multi-branched lead 938 has branches 950 extending outwardly onto the projections. Individual branches can be interrupted by severing one or more of the projections as, for example, by severing projection 925A so as to interrupt branch 950a. This operation can be performed using a die or blade having recesses where projections are to remain attached. In the completed, stacked assembly, the remaining projections 925 can be bent out of the plane of the circuit panel, as shown in FIG. 19 at 925', so that the projections do not add substantially to the horizontal extent of the assembly.

Figure 20:
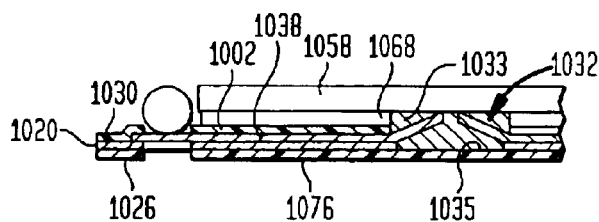
FIG. 20 is a fragmentary, diagrammatic sectional view of a unit in accordance with yet another embodiment of the invention.

Numerous variations and combinations of the features discussed above can be utilized without departing from the present invention. For example, the various circuit panels may include additional features such as ground or power planes or additional layers of traces. The traces and other conductive features of each panel can be placed on the second or chip-facing side of the panel rather than on the first side remote from the chip. For example, as shown in FIG. 20, the dielectric layer 1020 has traces 1038 on the second or chip-facing side 1030 of dielectric layer 1020. An additional solder mask layer 1002 may be provided over the traces on side 1030 in addition to the solder mask layer 1076, which also serves as the heat transfer or thermal layer of the unit. Here again, the encapsulant 1033 within opening 1034 has a surface 1035 flush with the first surface 1026 of the dielectric layer or recessed relative to such surface, so that the first surface is substantially flat. In a variant, the solder mask layer 1076 on the first surface may be removed after introduction of the encapsulant. In this instance, the dielectric layer 1020 serves as the thermal or heat transfer layer of the unit and abuts the next lower chip in the stack. In a further variant, the solder mask layer 1002 on the second or chip-facing side of the dielectric layer may be omitted or may be integrated with the adhesive layer 1068. Also, each unit can include more than one chip. The chips included in the various units may be memory chips as, for example, DRAM, Flash, ROM, PROM or EEPROM chips. The invention also can be employed in packaging other chips as, for example, processors or application-specific integrated circuits (ASICs). Also, the "select" terminals need not convey a signal such as "chip select" commonly used in a memory array; any signal which is desirably routed to a specific chip or chips in a stack can be conveyed. The adhesive layers, leads and panels may be arranged to permit movement of the unit terminals of each unit with respect to the chip of that unit, so as to alleviate stresses due to thermal expansion. Also, the heat transfer layers may allow relative movement of adjacent units. Further, the stacked assembly can include one or more non-identical units in addition to the units substantially as described above. For example, the different units in the stack may include different chips. In yet another variant, features discussed above can be used in a structure where each unit has the chip disposed in an orientation, with the rear face of the chip abutting the dielectric layer of such unit and with the contact-bearing, front face, facing away from the dielectric layer. In such an embodiment, the contacts can be connected to the traces by wire bonds or other conductors. In such an embodiment, the front face of each chip, or a layer of encapsulant overlying the front face, may abut the dielectric layer of the next adjacent unit.

In the embodiments discussed above, the conductive elements connecting the various units to one another and forming the vertical conductors are conventional solder balls. Other conductive elements may be employed instead. For example, so-called "solid core solder balls" can be used. Solid core solder balls include cores formed from a material having a relatively high melting point and a solder having a melting temperature lower than the melting temperature of the core. Still other conductive elements can be formed from masses of a conductive polymer composition.

As these and other variations and combinations of the features set forth above can be utilized, the foregoing description of the preferred embodiment should be taken by way of illustration rather than by limitation of the invention.

What is claimed is:

1. A semiconductor chip assembly comprising:
   (a) a plurality of units, each such unit. including:
      (i) a semiconductor chip having at least one chip select contact and a plurality of other contacts and
      (ii) a circuit panel having a plurality of chip select terminals, a plurality of other terminals, and traces extending on or in the panel electrically connected between the contacts of the chip and the terminals, the trace electrically connected to each chip select contact being a multi-branched trace including a common section connected to the select contact and a plurality of branches connected to different ones of the chip select terminals, at least one branch, but less than all branches, of each such multi-branched trace having an interruption therein so that the select contact is connected to less than all of the chip select terminals; and
   said units being disposed one above the other in a stack of superposed units; and
   (b) vertical conductors interconnecting the terminals of the units in the stack to form a plurality of vertical buses, said chip select terminals of different units being connected to the same vertical buses, said interruptions in said multi-branched traces being arranged so that the chip select contacts of different units are electrically connected to different ones of said vertical buses.

2. A semiconductor assembly as claimed in claim 1 wherein, in each said unit, all but one branch of each said multi-branched trace has an interruption therein so that each chip select contact is connected to only one said chip select terminal of that unit.

3. A semiconductor assembly as claimed in claim 1 wherein the chips, traces and terminals of different units are identical to one another except that different ones of said units have different branches interrupted so that the chip select contacts of different units are connected to different terminals on the circuit panels of such units.

4. A semiconductor assembly as claimed in claim 3 wherein corresponding terminals of different units are disposed one above the other.

5. A semiconductor assembly as claimed in claim 3 wherein said identical units in said stack include a bottom unit, said terminals of said bottom unit being exposed for interconnection to an external substrate.

6. A semiconductor assembly as claimed in claim 3 wherein said identical units in said stack include a bottom unit, the assembly further comprising a translator underlying said bottom unit, said translator having contact pads connected to said vertical buses and having terminals connected to said contact pads, the terminals of the translator being exposed for connection to an external substrate.

7. A semiconductor assembly as claimed in claim 2 wherein said identical units in said stack include a bottom unit, the assembly further comprising an additional unit underlying said bottom unit, said additional unit including a semiconductor chip and a circuit panel having terminals exposed for connection to an external substrate, said terminals of said additional unit being disposed in a pattern different from the terminals of said identical units in said stack, at least some of said terminals of said additional unit being electrically connected to said vertical buses, at least some of said terminals of said additional unit being electrically connected to the chip of said additional unit.

8. A semiconductor assembly as claimed in claim 1 wherein the circuit panel of each said unit includes only a single layer of electrically conductive material constituting said traces and said terminals.

9. A semiconductor assembly as claimed in claim 8 wherein the circuit panel of each said unit includes a dielectric layer less than about 100 µm thick.

10. A semiconductor assembly as claimed in claim 9 wherein the chip of one said unit is disposed between the dielectric layer that unit and the dielectric layer of an adjacent one of said units, and wherein the vertical distance between corresponding surfaces of such dielectric layers is no more than 250 µm greater than the thickness of the semiconductor chip in such unit.

11. A semiconductor assembly as claimed in claim 10 wherein a vertical spacing distance between corresponding features in adjacent ones of said units is no more than 250 µm greater than the thickness of each chip.

12. A semiconductor assembly as claimed in claim 1 wherein said circuit panel of each said unit includes a dielectric layer with at least one disconnection aperture therein, said interruptions being formed at said disconnection apertures.

13. A semiconductor assembly as claimed in claim 1 wherein the circuit panel of each said unit has edges and one or more notches extending inwardly from one or more of said edges, said interruptions being formed at said notches.

14. A semiconductor assembly as claimed in claim 13 wherein said terminals of each said unit include a first outer row of terminals disposed adjacent to a first edge of the circuit panel, said first outer row of terminals defining a first inner border remote from said first edge, at least some of said branches having outboard portions extending outwardly beyond the first inner border, at least one of said notches defining at least one interruption in at least one said outboard portion.

15. A semiconductor assembly as claimed in claim 13 wherein said terminals of each said unit include a first outer row of terminals disposed adjacent to a first edge of the circuit panel of such unit, the first edge having at least one protrusion extending outwardly from the remainder of the first edge, at least one of said branches extending onto said protrusion.

16. A semiconductor chip assembly as claimed in claim 15 wherein the circuit panel of each said unit is substantially planar and the protrusion of each said circuit panel projects vertically from the plane of the circuit panel.

17. A semiconductor chip assembly comprising:
(a) a plurality of units, each unit including:
(i) a semiconductor chip having contacts on front surface; and
(ii) a circuit panel having a central region and a peripheral region, the panel including a dielectric layer having first and second surfaces, at least one bond window extending between said first and second surfaces in said central region and a plurality of terminal apertures extending between the first and second surfaces in said peripheral region, each said panel including a single metallization layer defining a plurality of terminal pads aligned with said terminal apertures a plurality of traces extending in horizontal directions along the panel, the chip being disposed with the front surface of the chip facing toward a surface of the panel in said central region, the contacts of the chip being connected to the traces of the panel in said at least one bond window;
said units being superposed on one another in a stack so that the rear surface of a chip in one unit faces toward a surface of the dielectric layer in a next adjacent unit, said units bearing on one another in at least those portions of the central regions occupied by said traces, the terminals of the units being aligned with one another; and
(b) a plurality of conductive masses disposed between the terminals of the units and connecting terminals of adjacent units through the terminal apertures of said panels.

18. A semiconductor chip assembly as claimed in claim 17 wherein said traces in each unit extend along the first surface of the dielectric layer in that unit and the front surface of the chip of in each unit faces toward the second surface of the dielectric layer in that unit.

19. A semiconductor chip assembly as claimed in claim 18 wherein at least some of said units include heat transfer layers overlying the traces of such unit, said units bearing on one another through said heat transfer layers.

20. A semiconductor chip assembly as claimed in claim 19 wherein at least some of said heat transfer layers extend across said bond windows and are substantially flat in the region extending across said bond windows.

21. A semiconductor chip assembly as claimed in claim 20 further comprising an encapsulant at least partially filling said bond windows.

22. A semiconductor chip assembly as claimed in claim 17 wherein each of said circuit panels includes a plurality of leads formed integrally with said traces, said leads extending into said at least one bond window of the circuit panel.

23. A semiconductor chip assembly comprising:
(a) a plurality of units, each unit including:
(i) a semiconductor chip having contacts on front surface; and
(ii) a circuit panel having a central region and a peripheral region, the panel including a dielectric layer having first and second surfaces, at least one bond window extending between said first and second surfaces in said central region, a plurality of terminal pads exposed at the first and second surfaces in said peripheral region and a plurality of including traces extending in horizontal directions along the panel, the chip being disposed with the front surface of the chip facing toward the second surface of the dielectric layer in said central region, the contacts of the chip being connected to the traces of the panel in said at least one bond window; and
(iii) an encapsulant in said at least one bond window, said encapsulant defining a surface substantially flush with the first surface of the dielectric layer,
said units being superposed on one another in a stack so that the rear surface of a chip in one unit faces toward a surface of the dielectric layer in a next adjacent unit, said units bearing on one another in at least those portions of the central region occupied by said traces, the terminals of the units being aligned with one another; and
(b) a plurality of conductive masses disposed between the terminals of the units and connecting terminals of adjacent units to one another.

24. A semiconductor chip assembly as claimed in claim 23 wherein each said dielectric layer is less than about 100 µm thick.

25. A semiconductor chip assembly as claimed in claim 23 wherein the chip of one said unit is disposed between the dielectric layer that unit and the dielectric layer of an adjacent one of said units, and wherein the vertical distance between corresponding surfaces of such dielectric layers is no more than 250 µm greater than the thickness of the semiconductor chip in such unit.

26. A semiconductor chip assembly as claimed in claim 23 wherein a vertical spacing distance between corresponding features in adjacent ones of said units is no more than 250 μm greater than the thickness of each chip.

27. A semiconductor chip assembly as claimed in claim 23 wherein each said unit further includes a substantially planar heat transfer layer overlying said at least one bond window and said encapsulant of such unit.

28. An in-process assemblage of interchangeable semi-finished units, each said unit including at least one semiconductor chip having at least one chip select contact and a plurality of other contacts and a circuit panel having a plurality of chip select terminals, a plurality of other terminals, and traces extending on or in the panel connected to said terminals, at least one trace of each said panel being a multi-branched trace including a common section and a plurality of branches connected to different ones of the chip select terminals, the contacts of the at least one chip in each unit being connected to traces of the circuit panel in that unit so that each chip select contact is connected to the common section of a multi-branched trace, said units including identical chips, identical terminals, and identical connections between contacts of the chips and terminals, said individual units being adapted for stacking one above the other with corresponding terminals of said units connected to one another.

29. An in-process collection of units as claimed in claim 28 wherein the circuit panels of a plurality of said units are portions of a common sheet.

30. An in-process collection of units as claimed in claim 28 wherein said sheet includes only a single layer of metallic features defining said traces and said terminals.

31. An in-process collection of units as claimed in claim 30 wherein each said circuit panel includes a dielectric layer less than 100 μm thick.

* * * * *

UNITED STATES PATENT AND TRADEMARK OFFICE
CERTIFICATE OF CORRECTION

PATENT NO. : 6,897,565 B2 Page 1 of 1
DATED : May 24, 2005
INVENTOR(S) : L. Elliott Pflughaupt et al.

It is certified that error appears in the above-identified patent and that said Letters Patent is hereby corrected as shown below:

Column 3,
Line 4, "trace have" should read -- trace has --.

Column 13,
Line 6, "overly the contact" should read -- overlie the contact --.
Line 8, "units overlies" should read -- units overlie --.
Line 53, "This, in" should read -- This in --.

Column 20,
Line 5, "unit. including" should read -- unit including --.

Column 21,
Line 8, "layer that" should read -- layer of that --.
Line 59, "apertures a" should read -- apertures and a --.

Column 22,
Line 12, "chip of in" should read -- chip in --.
Line 64, "layer that" should read -- layer of that --.

Signed and Sealed this

Twenty-third Day of August, 2005

JON W. DUDAS
*Director of the United States Patent and Trademark Office*